US012261045B2

(12) United States Patent
Blanco et al.

(10) Patent No.: US 12,261,045 B2
(45) Date of Patent: Mar. 25, 2025

(54) PATTERNING METHOD

(71) Applicant: IMEC VZW, Leuven (BE)

(72) Inventors: Victor M. Blanco, Leefdaal (BE); Frederic Lazzarino, Hamme-Mille (BE)

(73) Assignee: IMEC VZW, Leuven (BE)

( * ) Notice: Subject to any disclaimer, the term of this patent is extended or adjusted under 35 U.S.C. 154(b) by 590 days.

(21) Appl. No.: 17/567,361

(22) Filed: Jan. 3, 2022

(65) Prior Publication Data

US 2022/0223415 A1   Jul. 14, 2022

(30) Foreign Application Priority Data

Jan. 14, 2021   (EP) ..................... 21151578

(51) Int. Cl.
*H01L 21/033* (2006.01)
*H01L 21/311* (2006.01)
*H01L 21/3213* (2006.01)

(52) U.S. Cl.
CPC .... *H01L 21/0337* (2013.01); *H01L 21/31144* (2013.01); *H01L 21/32139* (2013.01)

(58) Field of Classification Search
CPC .. C02F 1/00; D01G 21/00; D06C 3/00; G06F 30/39; G06F 30/394; G06F 2119/18;
(Continued)

(56) References Cited

U.S. PATENT DOCUMENTS 9,570,580 B1 * 2/2017 Chiang ............. H01L 21/76224
9,691,626 B1 * 6/2017 Bouche ............... H01L 21/0337
(Continued)

FOREIGN PATENT DOCUMENTS

BE   3618103 A1 *   8/2018 ............... G03F 7/16
BE   4030465 A1 *   7/2022 ......... H01L 21/0337
EP   3618103 A1     3/2020

OTHER PUBLICATIONS

European Search Report for application No. EP21151578.8 dated Jun. 21, 2021.

*Primary Examiner* — Shaun M Campbell
*Assistant Examiner* — Joseph L Bell
(74) *Attorney, Agent, or Firm* — MOSER TABOADA

(57) ABSTRACT

According to an aspect there is provided a patterning method comprising:
over a lower pattern memorization layer, forming a pattern of first upper blocks, then an upper pattern memorization layer and then a pattern of second upper blocks;
thereafter patterning upper trenches in the upper pattern memorization layer using lithography and etching, and forming spacer lines along sidewalls of the upper trenches to define spacer-provided upper trenches, at least a subset being interrupted by a respective first upper block;
patterning first lower trenches in the lower pattern memorization layer by etching the spacer-provided upper trenches into the lower pattern memorization layer, at least a subset of the first lower trenches being interrupted by a lower pattern memorization layer portion preserved at a location defined by a respective one of the first upper blocks;
thereafter, forming an auxiliary trench mask stack and patterning auxiliary trenches therein using lithography and etching; and
thereafter, patterning the second lower trenches in the lower pattern memorization layer, the patterning comprising using the patterned auxiliary trench mask stack, the spacer lines and the second upper blocks as etch masks, at least a subset of the second lower trenches being interrupted by a lower pattern memorization
(Continued)

layer portion preserved at a position defined by a respective one of the second upper blocks.

15 Claims, 24 Drawing Sheets

(58) Field of Classification Search
CPC ..... G16Z 99/00; H01L 21/302; H01L 21/311; H01L 21/337; H01L 21/461; H01L 21/76802; H01L 21/76808; H01L 21/76811; H01L 21/76813; H01L 21/76816; H01L 21/76843; H01L 21/76897; H01L 23/5226; H01L 23/53228; H01L 21/768; H01L 21/3213; H01L 21/027; H01L 21/033; H01L 21/31144; H01L 21/32139
See application file for complete search history.

(56) References Cited

U.S. PATENT DOCUMENTS

| | | | |
|---|---|---|---|
| 2017/0140986 A1* | 5/2017 | Machkaoutsan | ............................. H01L 21/76808 |
| 2018/0261497 A1* | 9/2018 | Drissi | ............... H01L 21/76897 |
| 2019/0309410 A1* | 10/2019 | De Silva | ........... H01L 23/53261 |
| 2020/0152472 A1* | 5/2020 | Devilliers | ............. G03F 7/0045 |

* cited by examiner

PATTERNING METHOD

CROSS-REFERENCE TO RELATED APPLICATIONS

This application claims benefit of EPC Application No. 21151578.8 filed on Jan. 14, 2021, which is herein incorporated by reference in its entirety.

TECHNICAL FIELD

The present inventive concept relates to a patterning method.

BACKGROUND

Lithography and etching processes ("litho-etch") are frequently used in semiconductor device fabrication, for instance to form trenches, openings or other patterns in e.g. a hard mask layer, a dielectric layer, a metal layer or a semiconductor layer. A pattern such as a trench pattern may be lithographically defined (i.e. exposed and developed) in a resist layer and transferred into an underlying layer by etching. The minimum critical dimensions (CDs) of litho-etch based patterning is dependent on the wavelength of the light used for exposing resist. Hence, extreme ultraviolet lithography (EUVL) enables patterns with reduced CDs compared to current technologies based on for instance 193i.

In spacer-assisted multiple patterning techniques (also known as self-aligned multiple patterning techniques) such as SADP or SAQP, grating-like patterning layers of mandrel lines and spacer lines may be used to form sub-lithographic tight pitch line patterns in an underlying layer. Multiple patterning may be combined with block techniques to enable forming of interrupted or discontinuous lines.

EP 3618103 discloses a patterning method based on a combination of two litho-etch processes supplemented with a spacer-assisted (SA) technique. The method may hence be referred to as a "SALELE" patterning process. The two LE processes allow two alternating sets of trenches to be patterned in a target layer. Employing two LE processes, allows comparably tight pitch patterns to be formed by combining two relaxed pitch patterns. Meanwhile, the addition of the spacer-assisted technique makes it possible to ensure an at least minimum separation between adjacent trenches in the target layer. Forming of interrupted trenches with small tip-to-tip separation is enabled through the use of block patterns.

Although state of the art patterning methods offers a path towards increasingly aggressive target CDs, more aggressive target CDs imply an increasing sensitivity towards process variability, notably a sensitivity to edge placement errors (EPE).

SUMMARY

In light of the above, it is an objective of the present inventive concept to provide a patterning method enabling forming of trench patterns, comprising interrupted trenches, with a reduced sensitivity to process variability, in particular an improved EPE margin. Further and alternative objectives may be understood from the following.

According to a first aspect of the present inventive concept there is provided a patterning method comprising:

over a lower pattern memorization layer for memorizing a pattern of first and second lower trenches, forming a pattern of first upper blocks, then an upper pattern memorization layer and then a pattern of second upper blocks;

thereafter patterning upper trenches in the upper pattern memorization layer using lithography and etching, and forming spacer lines along sidewalls of the upper trenches to define spacer-provided upper trenches, at least a subset being interrupted by a respective first upper block;

patterning the first lower trenches in the lower pattern memorization layer by etching the spacer-provided upper trenches into the lower pattern memorization layer, at least a subset of the first lower trenches being interrupted by a respective (first) lower pattern memorization layer portion preserved at a location defined by a respective one of the first upper blocks;

thereafter, forming an auxiliary trench mask stack and patterning auxiliary trenches therein using lithography and etching; and thereafter, patterning the second lower trenches in the lower pattern memorization layer, the patterning comprising using the patterned auxiliary trench mask stack, the spacer lines and the second upper blocks as etch masks, at least a subset of the second lower trenches being interrupted by a respective (second) lower pattern memorization layer portion preserved at a position defined by a respective one of the second upper blocks.

The inventive method allows "memorizing" a pattern of first and second trenches in a lower pattern memorization layer. The memorized pattern may subsequently be used to pattern an underlying layer, which e.g. may form a "target layer". The inventive method is based on an advantageous combination of two litho-etch (LE) patterning processes supplemented with a spacer-assisted (SA) technique. Accordingly, also the present inventive method may be referred to as a "SALELE" patterning process, and confers advantages corresponding to those of the afore-mentioned SALELE process. Among others, the inventive method enables an increased flexibility for the shape of the trench patterns compared to conventional SADP and SAQP techniques. Additionally, the method enables forming of trench patterns with smaller CDs than provided by conventional pure lithographical patterning techniques.

Furthermore, employing LE processes for patterning the upper trenches and for patterning the second lower trenches, allows comparably tight pitch patterns to be formed by combining two relaxed pitch patterns, e.g. a first sub-pattern comprising the first lower trenches, and subsequently a second sub-pattern comprising the second lower trenches. This may be particularly advantageous in combination with EUVL, which otherwise is a technique prone to stochastic failures if used to directly form aggressively scaled patterns. Relaxed printing may provide corresponding advantages also in 193i applications.

The first upper blocks define locations of interruptions for at least a subset of the first lower trenches to be formed in the lower pattern memorization layer. The second upper blocks define locations of interruptions for at least a subset of the second lower trenches to be formed in the lower pattern memorization layer.

The use of blocks to define trench interruptions enable forming of interrupted trenches with smaller tip-to-tip separation than would be achievable by directly "printing" lithography-defined interrupted trenches into the pattern memorization layers.

As further set out below, the first and second upper block formation may involve a tone-inversion approach, i.e. comprising filling openings in a (first/second) auxiliary block mask layer with a material. A tone-inversion approach enables definition of even smaller tip-to-tip separations than a "positive" printing of blocks in a layer. It further enables use of trimming techniques to achieve even smaller tip-to-tip separations, as will be set out below.

According to the method, the first and second lower trenches may each comprise one or more interrupted trenches, as defined by the pattern of first upper blocks (hereinafter the first upper block pattern) and the pattern of second upper blocks (hereinafter the second upper block pattern), respectively. By a trench being "interrupted" is hereby meant that the trench comprises a pair of aligned trench sections separated by a trench interruption, e.g. a block, or a portion of the layer in which the trench sections are formed.

The patterning of the first lower trenches comprises etching the spacer-provided upper trenches into the lower pattern memorization layer. The spacer-provided upper trenches may hence be transferred into the lower pattern memorization layer by etching, to form first lower trenches conforming to the spacer-provided upper trenches. As the spacer-provided upper trenches comprises one or more trenches interrupted by a first upper block, corresponding trench interruptions may be formed in the first lower trenches at locations underneath, and hence defined by, the first upper blocks. Accordingly, the method may comprise using the first upper blocks as etch masks while etching the spacer-provided upper trenches into the lower pattern memorization layer.

The patterning of the second lower trenches comprises using the second upper blocks as etch masks. The second upper blocks may hence (similar to the first upper blocks) be transferred into the lower pattern memorization layer, as second lower pattern memorization layer portions forming trench interruptions of the second lower trenches. The transfer of the second upper blocks into the lower pattern memorization layer may be a sequential process, in that the second upper block pattern is sequentially transferred (by etching) into one or more layers intermediate the second upper blocks and the lower pattern memorization layer, and finally into the lower pattern memorization layer.

Forming second upper blocks prior to patterning the upper trenches in the upper pattern memorization layer allows the ends of the second upper blocks to be self-aligned with respect to the upper trenches, and consequently with respect to the first lower trenches. As will be further described below, if a portion of a second upper block protrudes into a region overlying a region where an upper trench will be formed, said portion may be removed before etching the upper trench.

It is to be noted that the second upper blocks may or may not be present as an etch mask until the patterning of the second lower trenches is completed. That is, the second upper blocks may be used as etch masks during at least an initial part of the patterning of the second lower trenches.

For example, the second upper blocks may be used as an etch mask during an initial pattern transfer step, wherein the pattern of second upper blocks first may be transferred into the upper pattern memorization layer, and/or into a supplementary pattern memorization layer which may be formed between the upper pattern memorization layer and the second block pattern. The second upper blocks may then optionally be removed and the second upper block pattern as memorized in the upper and/or supplementary pattern memorization layer may instead be used as etch masks during final transfer step into the lower pattern memorization layer. In either case, trench interruptions may be formed in the second lower trenches at locations underneath, and hence defined by, the second upper blocks.

The first and second lower pattern memorization layer portions may in the following be referred to as first and second lower blocks or block portions, respectively, although they may form continuous portions of the patterned lower pattern memorization layer rather than discrete blocks of material like the first and second upper blocks.

The inventive method may confer the above-discussed advantages in conjunction with allowing a reduced sensitivity to process variability, in particular an improved margin against EPE during the patterning of the second lower trenches.

According to embodiments, the improved margin may be facilitated, at least in part, by the formation of the first upper blocks and memorizing the first upper blocks also as respective lower pattern memorization layer portions/first lower block portions. Thereby, during patterning the second lower trenches, the first lower pattern memorization layer portions may be masked by the first upper blocks The first upper blocks (which according to embodiments may be single- or two-toned blocks) may thus provide masking of the first lower block portions during the patterning of the second lower trenches. Hence, even if an auxiliary trench in the auxiliary trench mask stack extends into a region above/overlying a first lower block portion, the first upper block may counteract etching of the first lower block. Hence, trench interruptions for the first lower trenches, memorized as the first lower block portions, may be preserved also following the second lower trench formation.

Moreover, according to the method the spacer lines may be present during the patterning of both the first and second lower trenches.

The presence of the spacer lines makes it possible to ensure an at least minimum separation between the first lower trenches and the second lower trenches. Hence, if an auxiliary trench in the auxiliary trench mask stack (by design or due to an EPE) extends above/overlaps a first lower trench, the spacer line portion extending along the exposed first lower trench may mask (and hence counteract etching of) a lower memorization layer portion underneath the spacer line portion. Thus, a second lower trench may be etched in the lower pattern memorization layer, via the overlapping auxiliary trench, while the spacer line portion ensures that said first lower trench and said second lower trench are separated by said masked lower memorization layer portion, e.g. having a width determined by a linewidth of the spacer line.

The method may comprise removing (remaining portions of) the auxiliary trench mask stack, the upper memorization layer and the spacer lines, subsequent to patterning the second lower trenches. The first upper blocks and the second upper blocks (if still present) may also be removed, as well as supplementary upper blocks (if present).

As may be appreciated from the above discussion, the lower and upper pattern memorization layers form separate layers, each formed of a respective material. A material of the lower pattern memorization layer ("lower layer material") and a material of the upper pattern memorization layer ("upper layer material") may thus be different. For example, the lower layer material may be a dielectric material such as an oxide or a nitride or a carbide. The upper layer material may be amorphous silicon (aSi).

The first upper blocks and second upper blocks may form respective patterns/sets of block-shaped bodies of material (block material) different from each one of the lower and upper pattern memorization layers. The first and second upper blocks may be formed of a same or different material. The block material may be a metal-comprising material such as a metal nitride, a metal carbide or a metal oxide.

The spacer lines may advantageously be formed of a material ("spacer material") which is different from each one of the upper layer material, the lower layer material and the block material(s). The spacer lines, may be formed of typical spacer materials, such as an atomic layer deposition (ALD) deposited oxide or nitride.

The spacer lines may be formed using a sidewall spacer formation process. Forming the spacer lines may comprise etching back a conformally deposited spacer layer. For example, a spacer layer may be conformally deposited (e.g. by ALD) over the patterned upper memorization layer, and covering the sidewalls and bottom surfaces of the upper trenches. The spacer layer may subsequently be subjected to an etch back (i.e. top-down by for example a vertically biased dry etch) such that the bottom surface of the respective upper trenches are exposed (again) and spacer layer portions remain on the upper trench sidewalls to form the spacer lines. A spacer formation process allows spacer lines to be reliably formed with uniform a linewidth/thickness, thereby contributing to reduced process variability.

As mentioned above, the first and second upper blocks may be formed using a tone-inversion approach:

Forming the pattern of the (first/second upper) blocks may comprise forming an (first/second) auxiliary block mask layer and block openings therein, and depositing block material in the block openings, wherein the block material deposited in the block openings form the (first/second upper) blocks.

The block material may be deposited over the auxiliary block mask layer and in the block openings and then etched back to expose the auxiliary block mask layer wherein the block material remaining in the block openings form the (first/second upper) blocks.

The block material may be conformally deposited such that block material deposited on sidewalls of the block openings merges in the block openings (thus closing/pinching off the block openings). The block material may be etched back (top-down) such that block material deposited outside the block openings is removed and block material remain in the block openings to form the first/second upper blocks. A conformal deposition may facilitate filling of small CD block openings.

In either case the first/second blocks may be formed by a single deposited block material, and hence be "single-toned" blocks.

The first auxiliary block mask layer may be formed over the lower pattern memorization layer prior to forming the upper pattern memorization layer. The first auxiliary block mask layer may be removed selectively to the block material in the block openings, prior to forming the upper pattern memorization layer. According to an alternative approach the upper pattern memorization layer may instead be formed over the first auxiliary block mask layer and the blocks in the block openings.

The second auxiliary block mask layer may be formed over the upper pattern memorization. The second auxiliary block mask layer may be removed selectively to the block material in the block openings, prior to patterning the upper trenches in the upper pattern memorization layer. According to an alternative approach the upper trenches may instead be patterned with the second auxiliary block mask layer remaining over the upper pattern memorization layer. Upper trenches may hence be patterned to extend through the second auxiliary block mask layer and further into the upper pattern memorization layer.

According to a variation, a tone-inversion approach may be combined with patterning of block features:

Forming the pattern of first upper blocks may comprise: forming a (first/second) block material layer and then an (first/second) auxiliary block mask layer, forming block openings in the (first/second) auxiliary block mask layer, depositing an auxiliary block material in the block openings; removing the auxiliary block mask layer selectively to the auxiliary block material; and thereafter patterning the block material layer using the remaining auxiliary block material as an etch mask.

The remaining auxiliary block material may form auxiliary blocks. The first/second upper blocks may be defined as "two-toned" blocks formed by the auxiliary blocks and the remaining block material layer portions preserved underneath the auxiliary blocks. This may confer an increased etch budget to the upper blocks. The auxiliary blocks may however be removed during subsequent process steps, or directly after patterning the block material layer, wherein the upper blocks may be formed by the remaining block material layer portions alone.

The auxiliary block material may be selectively deposited on a bottom surface in the auxiliary block openings to form the auxiliary blocks. The block material layer surface portions in the auxiliary block openings may be used as a seeding surface during the selective deposition. The auxiliary block material may be a metal. A block material layer of a metal nitride may facilitate seeding. Another example auxiliary block material is a metal oxide.

The first block material layer and auxiliary block mask layer may be formed over the lower pattern memorization layer prior to forming the upper pattern memorization layer. The second block material layer and auxiliary block mask layer may be formed over the upper pattern memorization.

In either of the above approaches, forming the block openings in the (first/second) auxiliary block mask layer may comprise lithography and etching.

Optionally, the lithography and etching step may be supplemented by a "shrinking" step to form the block openings with a reduced CD, wherein initial block openings may first be formed in the (first/second) auxiliary block mask layer using lithography and etching and subsequently forming the (final) block openings by depositing a liner layer conforming to sidewalls of the initial block openings.

The liner layer may be conformally deposited. The (conformal) liner layer may be subjected to an etch back (e.g. subjecting a conformally deposited liner layer to an anisotropic etch in a top-down direction) to remove liner layer portions (horizontally oriented) bottom surfaces of the block openings such that liner layer portions on the (vertically oriented) sidewalls of the initial block openings remain.

Patterning the upper trenches may comprise forming an upper auxiliary trench mask stack over the upper pattern memorization layer, patterning auxiliary upper trenches therein comprising using lithography and etching, and etching the auxiliary upper trenches into the upper pattern memorization layer. Upper trenches conforming the auxiliary upper trenches may hence be formed in the upper pattern memorization layer.

According to embodiments, at least a subset of the second upper blocks may be formed such that a respective portion thereof protrude into a region in which an auxiliary upper trench is to be formed. In other words, the respective portions may each protrude into a (respective) region overlying a portion of the lower pattern memorization layer in which a first lower trench is to be formed. The respective portions of the second blocks may exposed in the auxiliary upper trenches. The method may further comprise etching away (i.e. removing by etching) the (protruding/exposed) respective portions from the auxiliary upper trenches. As discussed above, this allows the ends of the second upper blocks to be self-aligned with respect to the upper trenches, and consequently with respect to the first lower trenches. The step of "etching away" may advantageously be performed prior to etching the auxiliary trenches into the upper pattern memorization layer.

According to embodiments, a supplementary pattern memorization layer may be formed between the upper pattern memorization layer and the second upper blocks, wherein the method may further comprise using the supplementary pattern memorization layer as an etch stop layer when etching away said respective portions from the auxiliary upper trenches. The patterning of the upper trenches may hence be facilitated by avoiding introducing thickness variations in the layer below when etching away the exposed portions of the second upper blocks. Additionally, an etch budget of the layer below may hence be preserved. The supplementary pattern memorization layer may be formed on an upper surface of the upper pattern memorization layer, which accordingly may form the layer below.

According to embodiments, at least a subset of the second lower trenches may be formed alternatingly with trenches of at least a subset of the first lower trenches. That is, among the trenches of these subsets, a second lower trench may be formed between a pair of first lower trenches, and vice versa. The alternating first and second lower trenches may hence form a reduced pitch trench pattern.

According to embodiments, at least one of said auxiliary trenches in the auxiliary trench mask stack may extend above a portion of the patterned lower pattern memorization layer in which a second lower trench is to be formed, and above an adjacent first lower trench, wherein said second lower trench is spaced from the adjacent first lower trench by a lower pattern memorization layer portion preserved under a spacer line. The auxiliary trench may hence extend into a region above/overlying a region where a second lower trench is to be formed and additionally a region above/overlying an already formed adjacent first lower trench. The second lower trenches may hence be etched into the (patterned) lower pattern memorization layer via relaxed width auxiliary trench openings in the auxiliary trench mask stack. The presence of the spacer lines may ensure a minimum separation between an adjacent first and second lower trench.

The at least one auxiliary trench may further extend (into a region) above/overlying a first upper block and a lower pattern memorization layer portion/first lower block portion located along/in the first lower trench, underneath the first upper block. Due to the presence of the first upper block above the first lower block portion, the lower memorization layer may however still be etched via the auxiliary trench opening without etching the earlier memorized trench interruption of the first lower trench (i.e. the first lower block portion therein).

According to embodiments wherein the supplementary pattern memorization layer is formed between the upper pattern memorization layer and the second blocks, the method may further comprise, prior to forming the auxiliary trench mask stack, patterning the supplementary pattern memorization layer to form a pattern of supplementary upper blocks conforming to the pattern of second upper blocks, the patterning comprising using the second upper blocks as an etch mask. Advantages associated with the supplementary pattern memorization layer were discussed above. The supplementary pattern memorization layer may further ensure that the pattern of second upper blocks may remain memorized (i.e. as the conforming pattern of supplementary upper blocks) even if the second upper blocks are removed/consumed during the course of the method.

The lower pattern memorization layer and the supplementary pattern memorization layer may be formed as layers with similar etch properties such that the pattern of second upper blocks may be transferred into the supplementary pattern memorization layer simultaneous to said etching of the spacer-provided upper trenches into the lower pattern memorization layer. This enables patterning of the supplementary patterning memorization layer without any additional etch step.

According to embodiments, the method may further comprise, prior to forming the auxiliary trench mask stack, patterning the (patterned) upper memorization layer to form a pattern of upper pattern memorization layer portions conforming to the pattern of second upper blocks. The patterning may comprise using the second upper blocks as etch masks.

The upper memorization layer may hence be removed from "non-block" regions, thus reducing the amount of upper memorization layer material that needs to be removed after patterning of the first and second lower trenches.

The second lower pattern memorization layer portions may be formed underneath the upper pattern memorization layer portions.

The upper pattern memorization layer portions (which may be referred to as "third upper block portions") may together with second upper blocks and/or supplementary upper blocks act as combined block etch masks for the lower pattern memorization layer during the patterning of the second lower trenches.

The first upper blocks may be formed with a greater thickness than the second upper blocks. After forming the pattern of upper pattern memorization layer portions and prior to forming the auxiliary trench mask stack, the method may further comprise removing the second upper blocks such that at least a thickness portion of the first upper blocks remain following removal of the second upper blocks. The remaining (thickness portion) of the first upper blocks may subsequently mask the first lower pattern memorization layer portions during patterning of the second lower trenches, more specifically while etching the second lower trenches in the lower pattern memorization layer. This is possible even if the first and second upper blocks comprise a same material, or of materials with similar etch properties. Hence, as discussed above, even if an auxiliary trench in the auxiliary trench mask stack extends into a region above/overlying a first lower block portion, the first upper block may counteract etching of the first lower block portion. Removing the second upper blocks allows avoiding remaining portions of the second upper blocks falling unto underlying layers during subsequent process steps of removing underlying materials.

Alternatively, the step of patterning third upper block portions in the patterned upper memorization layer prior to forming the auxiliary trench mask stack may be omitted. According to alternative embodiments, the auxiliary trench mask stack may instead be formed over the upper pattern memorization layer with the spacer-provided upper trenches patterned therein. Patterning the second lower trenches in the lower pattern memorization layer may then comprise etching back upper surface portions of the patterned upper pattern memorization layer exposed in the auxiliary trenches and subsequently etching back upper surface portions of the lower pattern memorization layer exposed in the auxiliary trenches.

During the etch back of the patterned upper pattern memorization layer, the second upper blocks and/or the supplementary upper blocks may act as an etch mask. A pattern of upper pattern memorization layer portions may hence be preserved at positions defined by the second/supplementary upper blocks. The second lower pattern memorization layer portions may be formed underneath the upper pattern memorization layer portions.

According to embodiments, the lower pattern memorization layer may be formed over a target layer and the method may further comprise, patterning the target layer using the patterned lower pattern memorization layer, wherein the target pattern layer is one of a hardmask layer, a dielectric layer or a metal layer.

"First target trenches" and "second target trenches" may hence be formed underneath the first lower trenches and second lower trenches, respectively.

The first and second target trenches may be patterned simultaneously in the underlying layer. The first and second target trenches may alternatively be patterned sequentially. That is, the first target trenches may be patterned in the target layer prior to the second target trenches. A simultaneous approach may allow reducing the number of times a layer below the target layer (such as an insulating layer) is exposed to etchants.

The method of above may advantageously be used in conjunction with a method for forming an interconnection structure. Hence, a method for forming an interconnection structure may in an aspect comprise:

forming over an insulating layer the lower pattern memorization layer and forming first and second lower trenches therein in accordance with the above method or any of the embodiments or variations thereof;

subsequent to forming the first and second lower trenches in the lower pattern memorization layer, patterning target trenches in the insulating layer using the lower pattern memorization layer (e.g. as an etch mask); and depositing a conductive material in the trenches in the insulating layer.

The first and second target trenches conforming to the first and second lower trenches, respectively, may accordingly be formed in the insulating layer.

The method may further comprise, after patterning first lower trenches in the lower pattern memorization layer and prior to forming the auxiliary trench mask stack, forming a (first) via hole etch (mask) stack and, using lithography and etching, a (first) via opening through the via hole etch stack exposing a bottom surface of a selected first lower trench in the lower pattern memorization layer. The method may further comprise etching the exposed bottom surface to form an opening in the target memorization layer. The method may further comprise etching the insulating layer through the (first) via opening to form a (first) via hole in the insulating layer.

Thereby, a (first) via hole may be formed in the insulating layer. The via hole may thanks to the patterning method be self-aligned with the selected first lower trench in the lower pattern memorization layer and consequently also with respect to a selected first target trenches in the insulating layer underneath the selected first lower trench.

The via opening may be formed at a location above/overlying the selected first lower trench. The via opening may expose spacer layer portions on opposite sides of the selected first lower trench. A width of the opening in the via hole etch stack may exceed a width of the selected first lower trench (i.e. a relaxed CD with respect to the width of the selected first lower trench). This enables a relaxed printing of the opening in the via hole etch stack.

The via hole etch (mask) stack may comprise a mask material filling the spacer-provided upper trenches and the first lower trenches, wherein forming the via opening may comprise etching the mask material selectively to the spacer lines (i.e. at a greater rate than the "spacer material"). This allows the via opening to be self-aligned with respect to the spacer lines. Additionally, preserved spacer line portions may increase the etch margin during the further transfer of the via opening into layers below.

The method may further comprise, after patterning first lower trenches in the lower pattern memorization layer and prior to forming the auxiliary trench mask stack, forming a (second) via hole etch (mask) stack and, using lithography and etching, a (second) via opening through the via hole etch stack, the upper memorization layer and the lower pattern memorization layer. The method may further comprise etching the insulating layer through the (second) via opening to form a (second) via hole in the insulating layer.

Thereby, a (second) via hole may be formed in the insulating layer. The via opening may thanks to the patterning method be self-aligned with a selected second lower trench in the target memorization layer and consequently also with respect to a selected second target trench in the insulating layer underneath the selected second lower trench.

The via opening in the (second) via hole etch (mask) stack may be formed at a location between a pair of upper trenches. A width of the opening in the via hole etch stack may exceed a spacing between said pair of upper trenches. This enables a relaxed printing of the opening in the via hole etch stack.

The upper memorization layer may be etched selectively to the spacer lines (i.e. the "upper material" may be etched at a greater rate than the "spacer material"). This allows the via opening to be self-aligned with respect to the spacer lines. Additionally, preserved spacer line portions may increase the etch margin during the further transfer of the via opening into layers below.

The method may comprise depositing the conductive material to fill the first and second target trenches in the insulating layer as well as the first and second via holes in the insulating layer.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

A method for patterning trenches will now be described with reference to FIGS. 1-19. The method comprises forming a pattern of trenches in a lower pattern memorization layer 14. The pattern of trenches may as described below be transferred into an underlying hardmask layer 12, which in turn may be used for patterning trenches in an insulating layer 10. In the illustrated method the hardmask layer 12 is hence a bottom-most or target pattern memorization layer 12, which may be used to pattern (final) target trenches in the insulating layer 10 (thus representing the final target layer). The trenches in the insulating layer 10 may be filled with a conductive material, such as a metal, to form conductive lines of an interconnection level of an interconnection structure, e.g. in the back-end-of-line (BEOL). It is however noted that the method has a more general applicability for patterning trenches in any layer. For example, the layer 12 to be patterned may be a semiconductor layer or a metal layer. The method is also compatible with a tone-inversion approach, wherein the trenches in the lower pattern memorization layer 14 may be etched into a target pattern memorization layer (e.g. a hardmask layer similar to hardmask layer 12). The trenches in the target pattern memorization layer may be filled with a gap fill material to form line-features of the gap fill material (e.g. an oxide, a-Si or SoC). The target pattern memorization layer may then be removed selectively to the line-features. The line-features may in turn be used as an etch mask during etching of a further underlying target layer (e.g. a metal layer, a semiconductor layer or a dielectric layer), to form line-features in said underlying layer.

Figure 1:
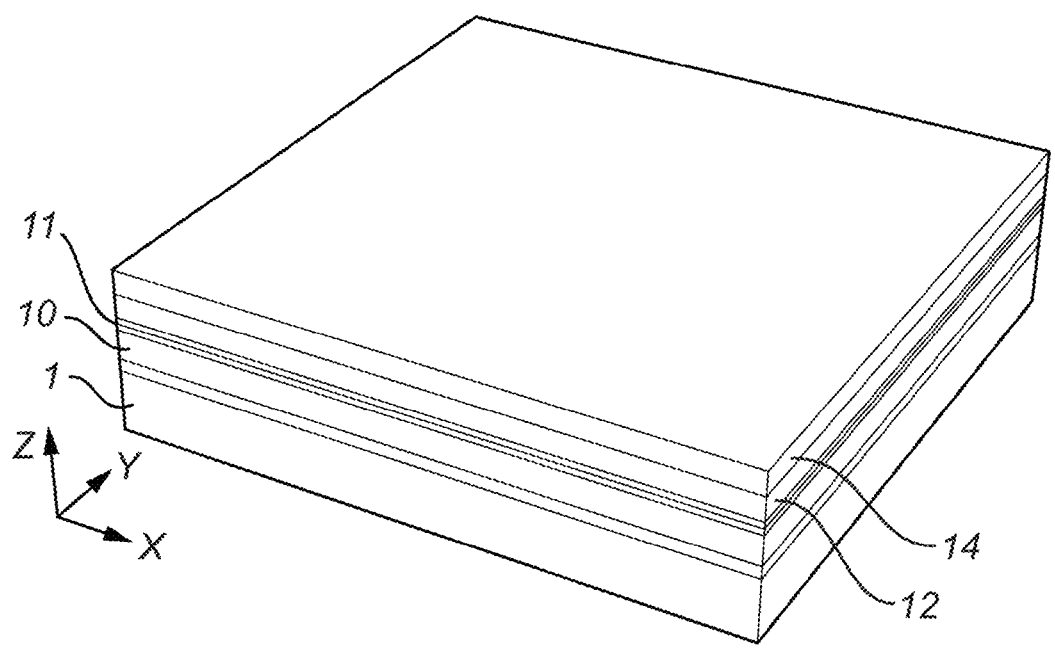
FIGS. 1-19 illustrate a process flow of a patterning method.

With reference to FIG. 1 there is shown, in perspective, a section of a structure which is to be subjected to the processing steps of the patterning method. The structure may extend laterally or horizontally beyond the illustrated section. The illustrated planes of section extending through the structure are common to all the figures unless stated otherwise. It is noted that the relative dimensions of the shown elements, in particular the relative thickness of the layers, is merely schematic and may, for the purpose of illustrational clarity, differ from a physical structure. In FIG. 1, directions X and Y indicates a first and a second horizontal direction, respectively, parallel to an in-plane direction (i.e. a main plane of extension and main surface of the layers). Direction Z indicates a vertical direction, or equivalently a bottom-up direction or layer stacking direction, thus normal to the main plane of extension and the main surface of the layers. As may be appreciated, terms such as "over", "above", "below", "upper", "underlying", "underneath" should be understood as relative positions as viewed along the vertical direction. A "width" of a trench or a "line width" of a feature should be understood to refer to a dimension along the second horizontal direction Y. A "longitudinal" or "length" dimension of e.g. a trench should be understood to refer to a dimension along the first horizontal direction X.

FIG. 1 depicts a layer stack comprising in the bottom-up direction a hardmask layer 12 and a lower pattern memorization layer 14. The lower pattern memorization layer 14 may as shown be formed on the hardmask layer 12. However, it is envisaged that interfacial layers, such as an adhesion layer, may be provided between the layers 12 and 14. If an interfacial layer is present, the interfacial layer may be patterned in a same step as the layer 14, or in a same step as the layer 12.

The hardmask layer 12 is formed of a hardmask material, for example of a metal-comprising material such as a metal nitride, a metal carbide or a metal oxide, for instance TiN, $W_xC_y$, $Al_xO_y$ or $Al_xN_y$. The lower pattern memorization layer 14 may be a layer of a dielectric material such as an oxide or a nitride or a carbide, for instance $SiO_2$, SiCO, SiC, SiN or SiCN. The layers 12, 14 may for instance be deposited by chemical vapor deposition (CVD), atomic layer deposition (ALD) or physical vapor deposition (PVD).

As used herein, the term "pattern memorization layer" refers to a layer (e.g. a hardmask layer) which through patterning may be used to "memorize" or "store" one or more parts of a "target" pattern, which may be further transferred into an underlying layer. For brevity, the term "memorization layer" may be used in the following.

As further shown in FIG. 1, the layer stack may be formed over an insulating layer 10. The insulating layer 10 may be of an oxide material, such as $SiO_2$, or another conventional lower-k dielectric. One or more interfacial layers 11, for example an interface layer and/or an oxide capping layer, may optionally be present between the target memorization layer 12 and the insulating layer 10.

The insulating layer 10 may be formed over a substrate 1, for instance a semiconductor substrate. An active device layer including semiconductor devices such as transistors may be fabricated on a main surface of the substrate 1. The active device layer may also be referred to as a front-end-of-line portion (FEOL-portion). The insulating layer 10 may be formed over (not shown) conductive structures, such as conductive lines of a lower interconnection level, or contact structures for devices, such as source/drain or gate contacts of semiconductor devices, as per se is known in the art.

Figure 2:
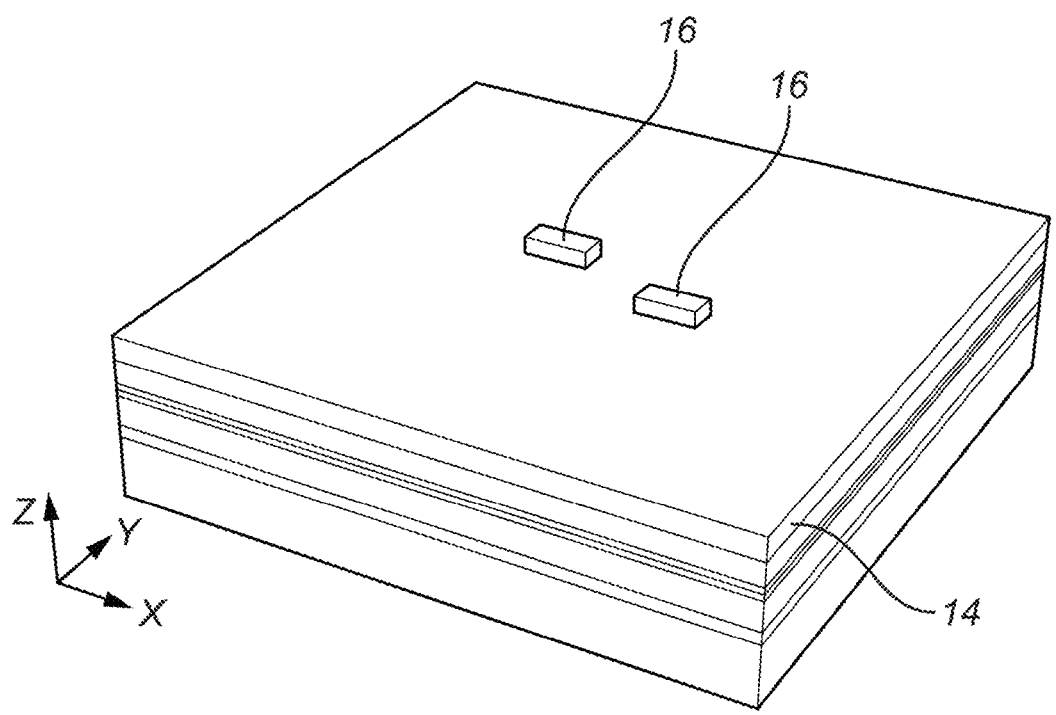
Figure 3:
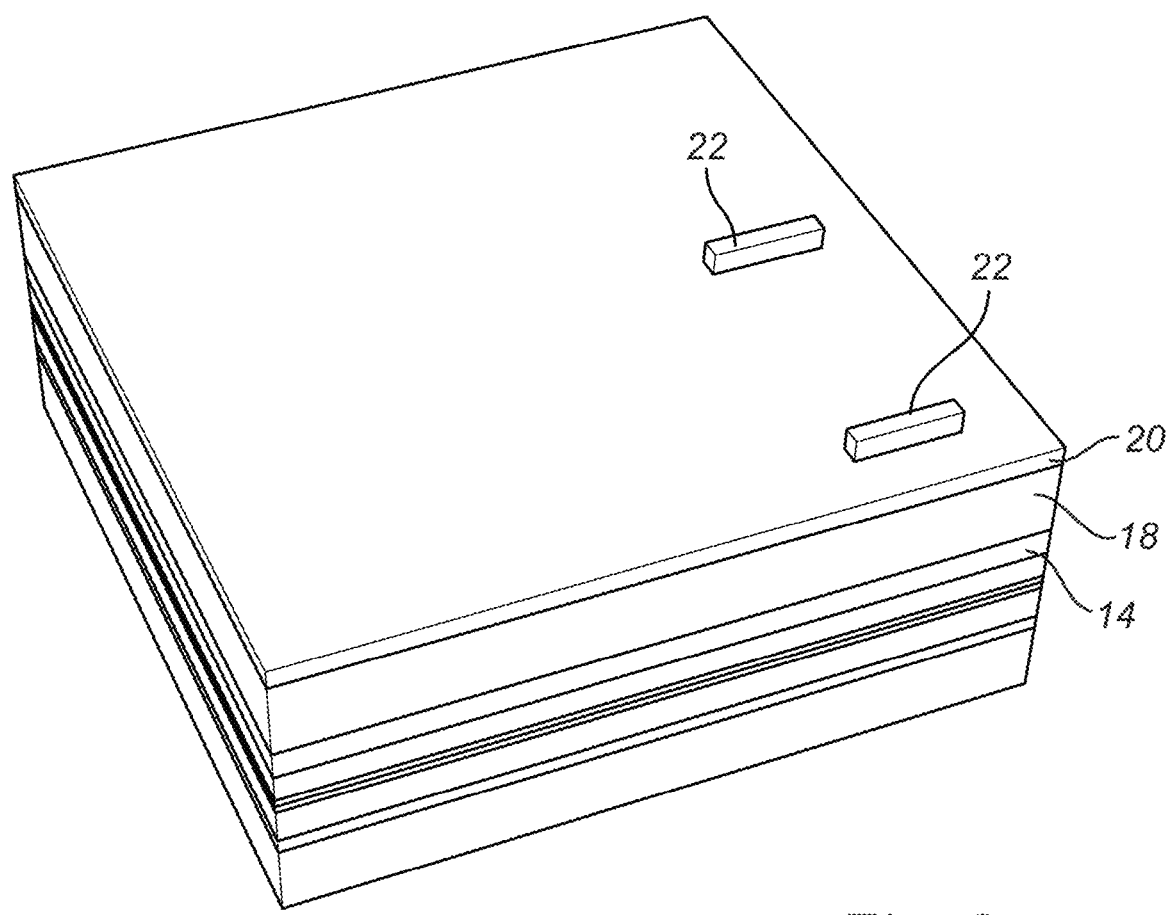

FIGS. 2-3 show how a pattern of first upper blocks 16, then an upper pattern memorization layer 18 and then a pattern of second upper blocks 22 are formed over the lower pattern memorization layer 14. The upper pattern memorization layer 18 will be used to memorize a set of upper trenches, as described below.

The first upper blocks 16 are formed on the lower memorization layer 14. The upper memorization layer 18 is formed on the lower memorization layer 14 and the first upper blocks 16. The upper memorization layer 18 thus covers the lower memorization layer 14 and the first upper blocks 16. The second upper blocks 22 are formed over the upper memorization layer 18.

The upper memorization layer 18 may for example be an a-Si layer, deposited e.g. by CVD, ALD or PVD. In FIG. 3, the upper memorization layer 18 is depicted with a planar upper surface. However, it should be noted that due to the presence of the first upper blocks 16, the upper surface of the upper memorization layer 20 may present a (slightly) varying topography. If such a topography variation is not desired, the upper surface may be planarized e.g. by CMP before subsequent process steps.

As shown, a supplementary pattern memorization layer 20 may further be formed between the upper pattern memorization layer 18 and the second upper blocks 22. The supplementary memorization layer 20 may be formed on the upper memorization layer 18 wherein the second upper blocks 22 may be formed on the supplementary memorization layer 20. In the following, it will be assumed that the layers 14 and 20 are formed as layers with similar etch properties, for example by being formed of a same material (e.g. SiN). The layer 20 may however also be of a different material, e.g. selected from any one of the materials discussed in connection with the lower memorization layer 14. The function of the supplementary memorization layer 20 will become apparent from the further description below. It is to be noted however that a supplementary pattern memorization layer 20 is optional and if absent, the second blocks 22 may be formed on the upper memorization layer 18 (i.e. directly).

The respective patterns of first and second upper blocks 16, 22 allow forming interrupted first and second lower trenches. Accordingly, each first/second upper block 16/22 is formed at a location overlying a respective portion of the lower memorization layer 16 which will define a trench interruption between two aligned trench sections (i.e. defining a "tip-to-tip" location for the trench sections) of the first/second lower of trenches to be formed.

The critical dimension (CD) of a block 16/22 may refer to a dimension of the block (or a corresponding block opening 104/204, see below) along direction X. Hence the CD of a block defines the dimension of the corresponding trench interruption or tip-to-tip separation.

The first and second upper blocks 16, 22 may be formed using a tone-inversion approach. A first approach for forming blocks will be disclosed with reference to FIGS. 20-23. A second approach for forming blocks will be disclosed with reference to FIGS. 24-27. Although the first and the second approach will be disclosed with reference to the first upper blocks 16 and the second upper blocks 22, respectively, it should be understood that both approaches are applicable to forming either the first or the second upper blocks 16, 22.

Figure 20:
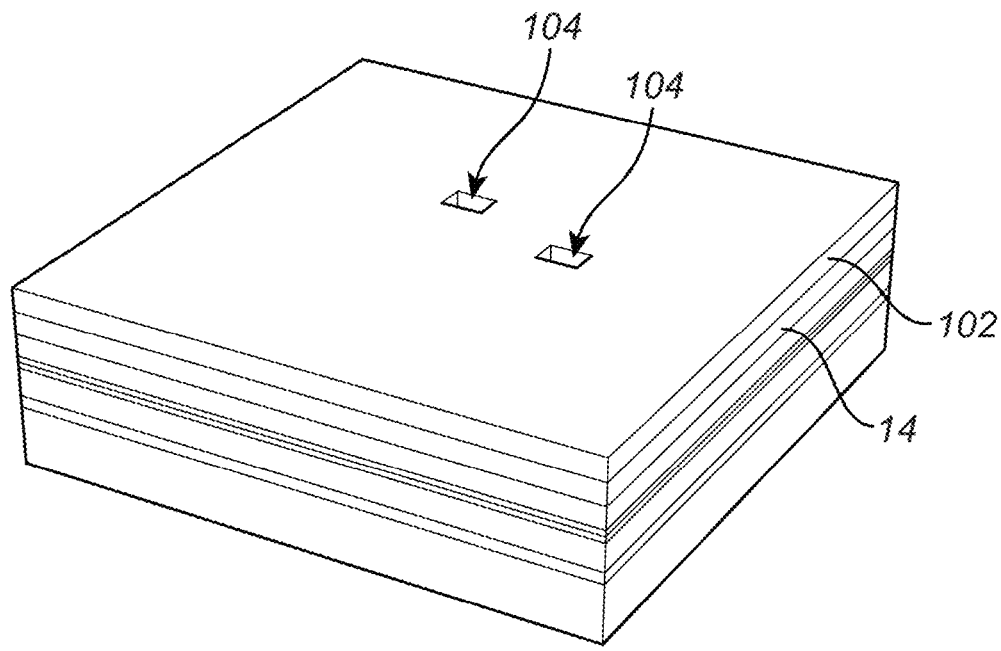
FIGS. 20-23 illustrate a first block formation approach.
Figure 21:
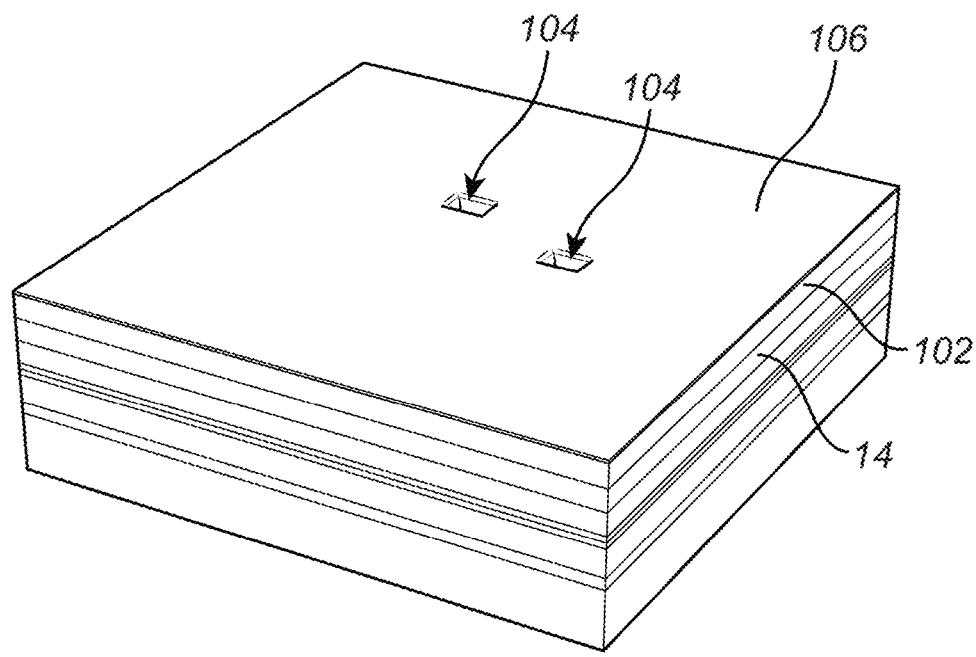
Figure 22:
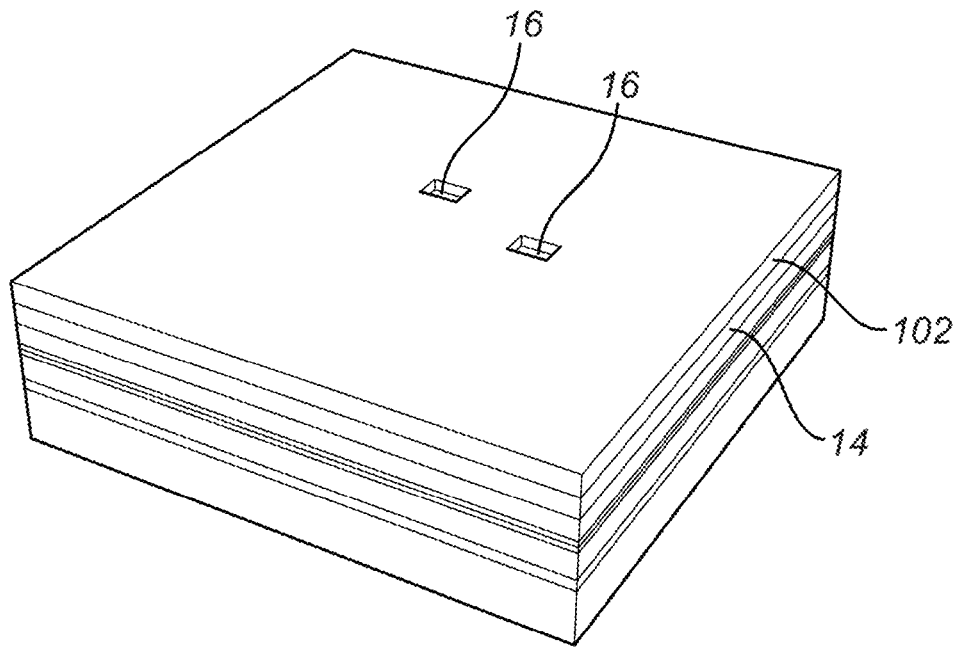
Figure 23:
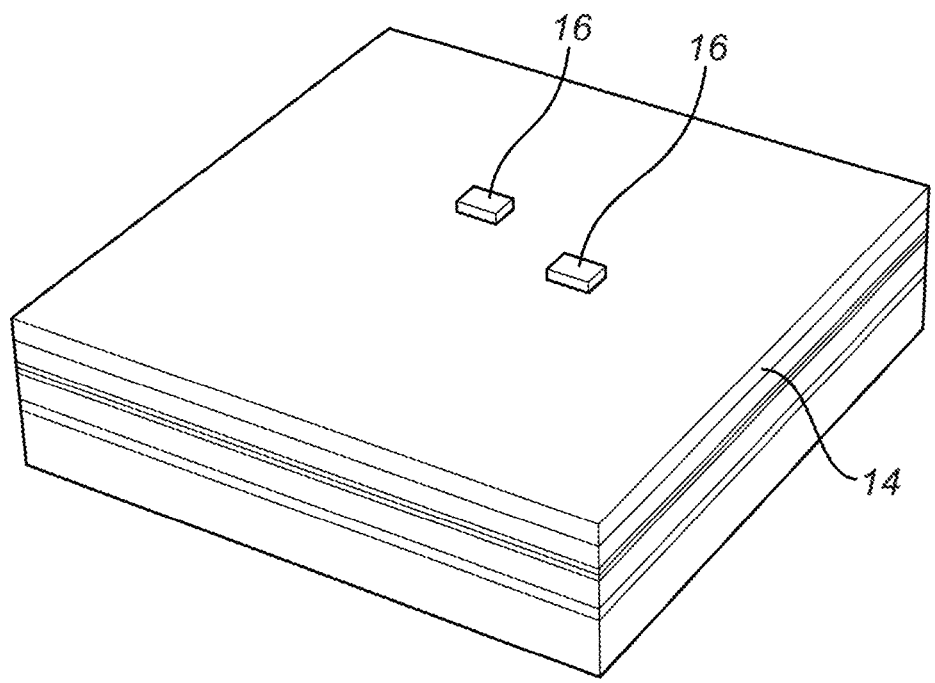
Figure 24:
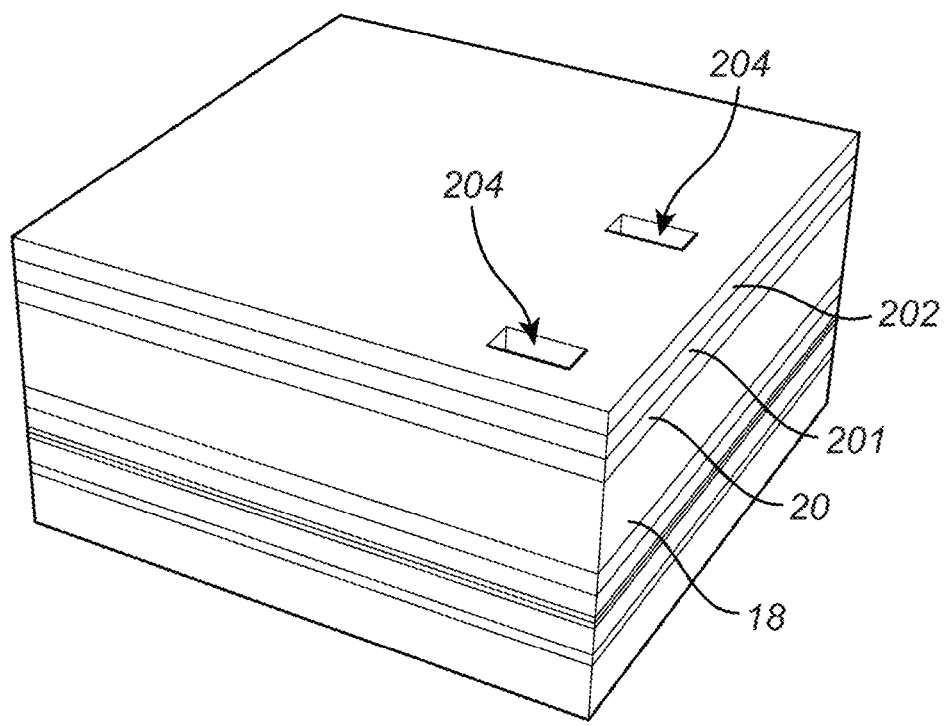
FIGS. 24-27 illustrate a second block formation approach.

In FIG. 20 an auxiliary block mask layer 102 is formed on the lower memorization layer 14. A pattern of block openings 104 are formed in the auxiliary block mask layer 102. In FIG. 21 a block material 106 is deposited over the auxiliary block mask layer 102 and in the block openings 104. In FIG. 22 the block material 106 is etched back to expose the auxiliary block mask layer 102 such that portions of the block material remain in the block openings form the first upper blocks 16.

The block openings 104 may be formed using lithography and etching. For example, a mask stack comprising a photo resist layer as a top-most layer may be formed on auxiliary block mask layer 102. A pattern of openings may be lithographically defined in the photo resist layer, and the openings may be etched into the mask stack and then into the auxiliary block mask layer 102. The thusly transferred openings in the auxiliary block mask layer 102 may define the pattern of block openings 104. A suitable wet or dry etching process may be used, for example RIE.

Optionally, a "shrinking" step may be performed to the transferred openings to define the (final) pattern of block openings 104, by conformally depositing a liner layer covering the auxiliary block mask layer 102 and conforming to sidewalls of the (initial) openings. Subsequently, an anisotropic etch back step may be applied to the liner layer (in a top-down direction) expose to the lower memorization layer 14 in the (reduced CD) block openings 104. The etch back may comprise a dry etching process, such as RIE.

The auxiliary block mask layer 102 may for example be an oxide such as $SiO_2$, a metal-comprising material such as a metal nitride or a metal oxide, for instance TiN, AlxNy, AlXOy TiOx or ZrOx, or a nitride or a carbide, for instance SiCO or SiN. A suitable conventional deposition process such as CVD, ALD or PVD may be used. The (optional) liner layer may be formed of a same material as layer 102, and be deposited by ALD. The block material may be deposited either conformally (e.g. by ALD), or non-conformally (e.g. by CVD or PVD). The block material may for example be a metal nitride or a metal oxide, for instance TiN, AlxNy, AlXOy TiOx or ZrOx, or a nitride or a carbide, for instance SiCO or SiN, but in any case different from the material of the auxiliary block mask layer 102, and also different from the material of the lower memorization layer 14, to enable etch selectivity.

The auxiliary block mask layer 102 may as depicted in the figures be removed after forming the first upper blocks 16. However, the auxiliary block mask layer 102 may also remain on top of lower memorization layer 14, wherein the upper memorization layer 18 may be formed on the auxiliary block mask layer 102 and the first upper blocks 16. As may be appreciated, each the auxiliary block mask layer 102 would then need to be opened prior to e.g. etching the lower memorization layer 14, but the method may otherwise proceed in the manner described herein.

According to the second block formation approach, a block material layer 201 and then an auxiliary block mask layer 202 are formed over the upper memorization layer 18. The auxiliary block mask layer 202 may as shown be formed on the block material layer 201. In the illustrated approach, the block material layer 201 is formed on the supplementary memorization layer 20. However, the block material layer 201 may also be formed on the upper memorization layer 18 if no layer 20 is formed.

Figure 25:
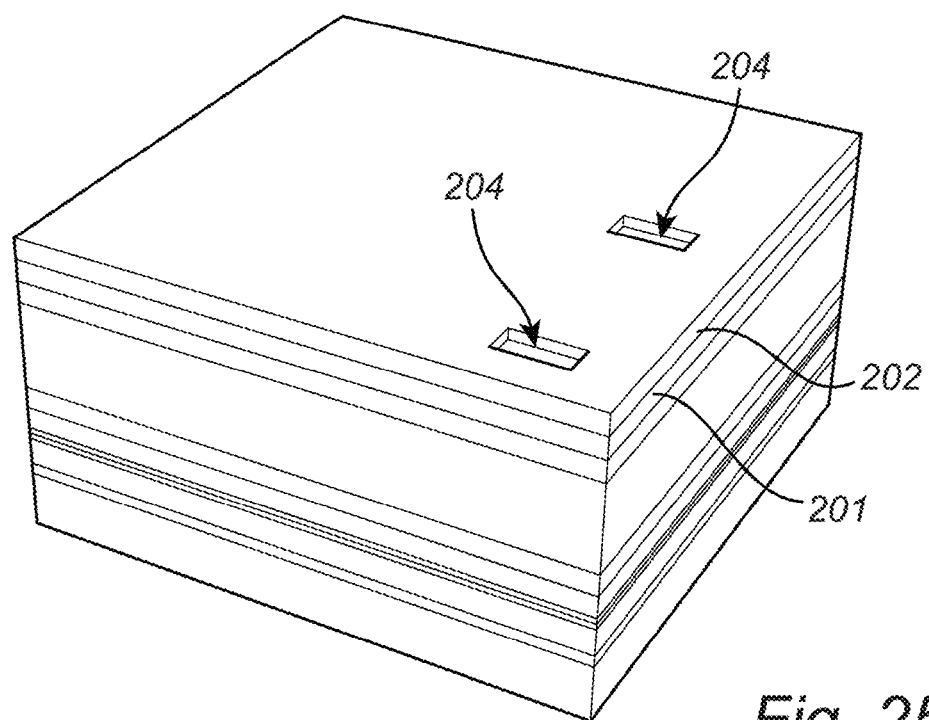
Figure 26:
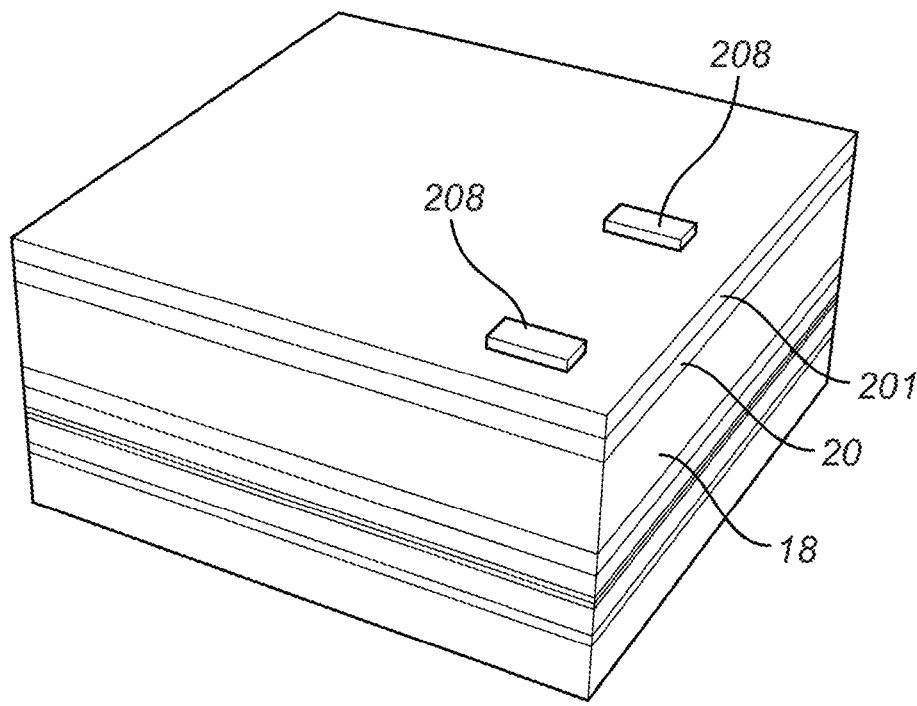
Figure 27:
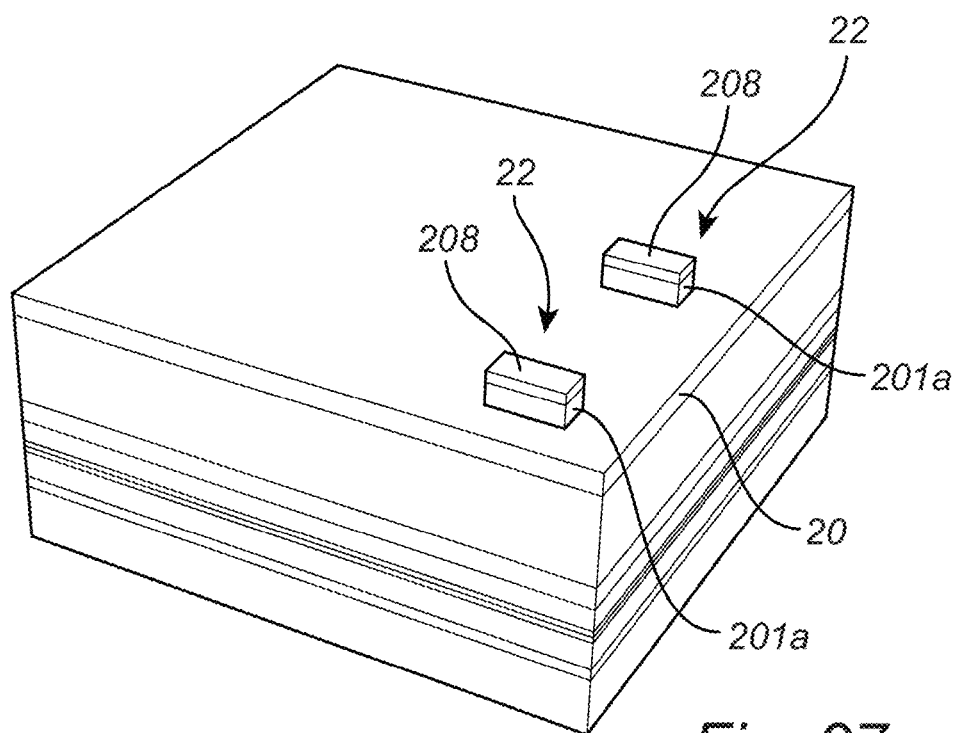

A pattern of auxiliary block openings 204 are formed in the auxiliary block mask layer 202. In FIG. 25 an auxiliary block material 208 is selectively deposited in the block openings 204. In FIG. 26 the auxiliary block mask layer 202 is removed selectively to the auxiliary block material 208 which remains to form auxiliary blocks 208. In FIG. 27, the block material layer 201 is patterned using the auxiliary blocks 208 as etch masks, such that portions 201a of the block material layer 201 remain underneath the auxiliary blocks 208. A dry etching process, such as RIE, may be used.

The auxiliary block mask layer 202 and the block openings 204 may each be formed using techniques similar as described above with reference to layers/openings 102/104. A shrinking step as described above may optionally be performed to form reduced CD block openings 204. The material examples listed for the layer 102 and the liner layer are applicable also to the second approach.

The auxiliary block material 208 may be selectively deposited on the bottom surface of the block openings 204, formed by the block material layer 201, wherein the block material bottom surface may act as a seeding surface for the material 208. A block material layer 201 of a metal nitride, for instance TiN, enables area selective deposition of a metal auxiliary block material 208, for instance Ru. TiN and Ru however only represent one example and other material combinations are also possible.

The deposition of the auxiliary block material 208 may proceed until auxiliary blocks 208 with a desired thickness have been formed in the block openings 204. The deposition may as indicated in FIG. 25 be stopped before the auxiliary blocks 208 fill the full depth of the block openings 204.

"Two-toned" upper blocks 22 may accordingly be formed by the auxiliary blocks 208 and the remaining block material layer portions 201a preserved, having an increased etch budget to the upper blocks. The auxiliary blocks may however be removed during subsequent process steps, or directly after patterning the block material layer, wherein the upper blocks may be formed by the remaining block material layer portions 201a alone.

Figure 4:
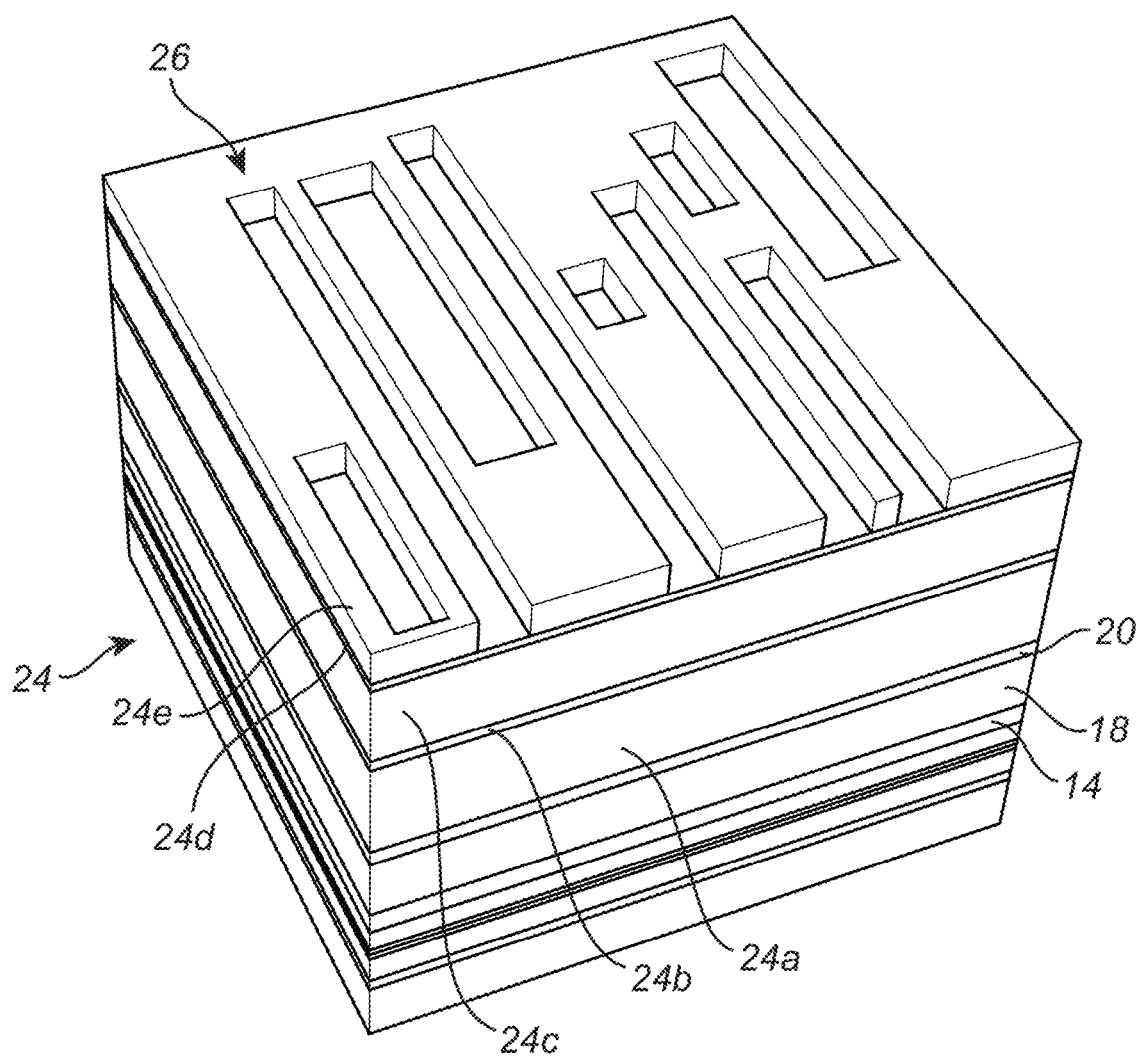
Figure 5:
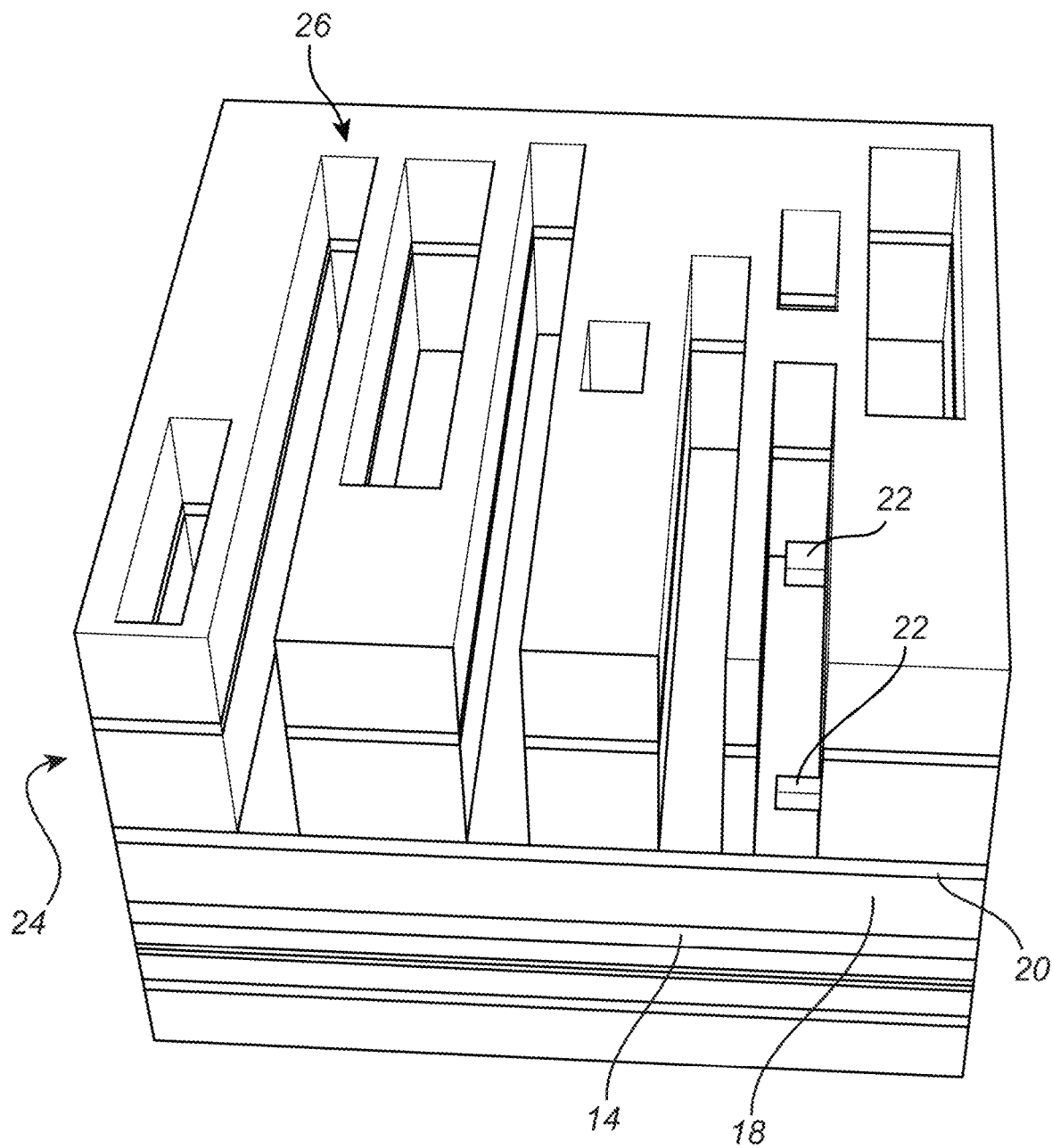
Figure 6:
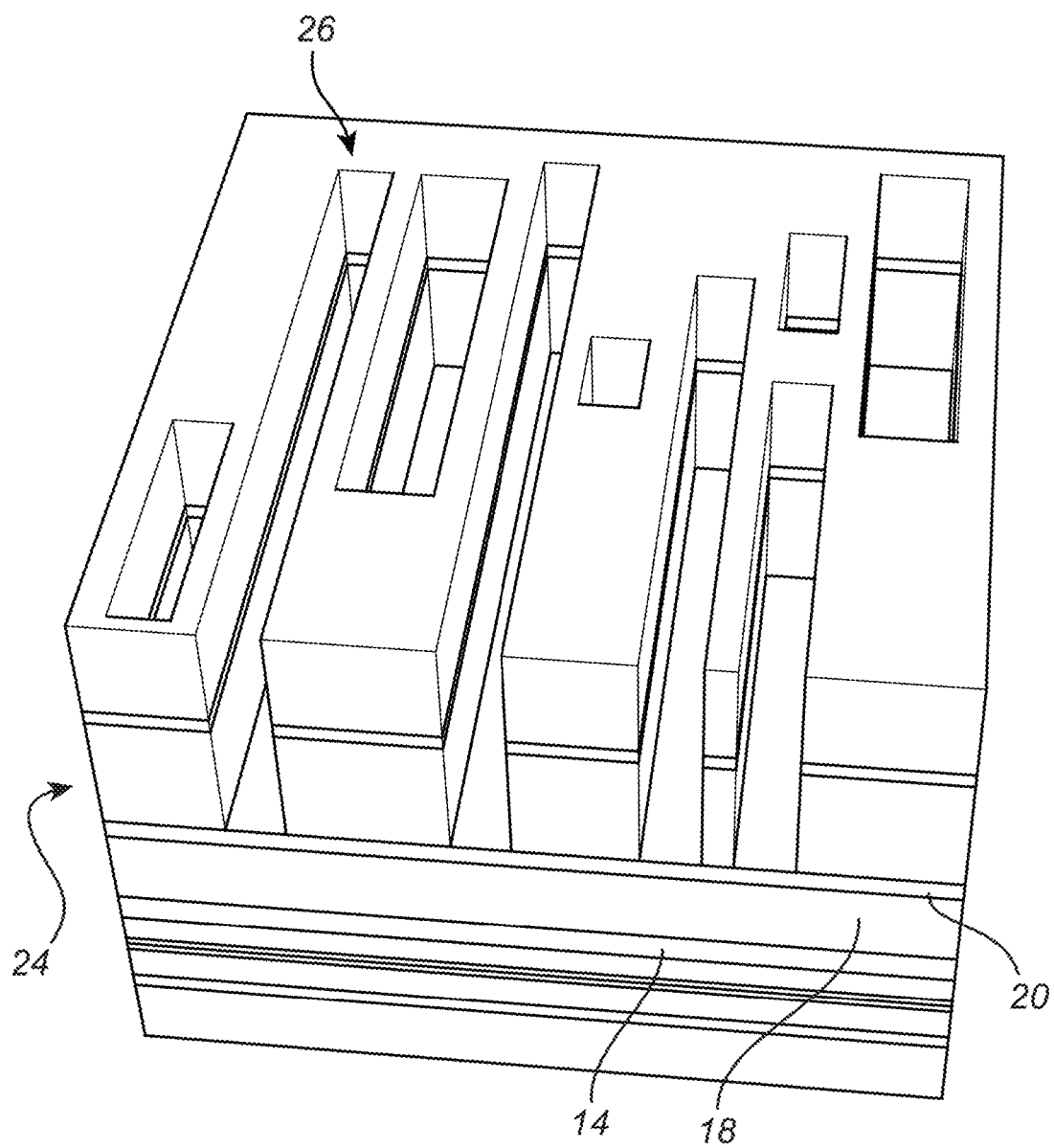
Figure 7:
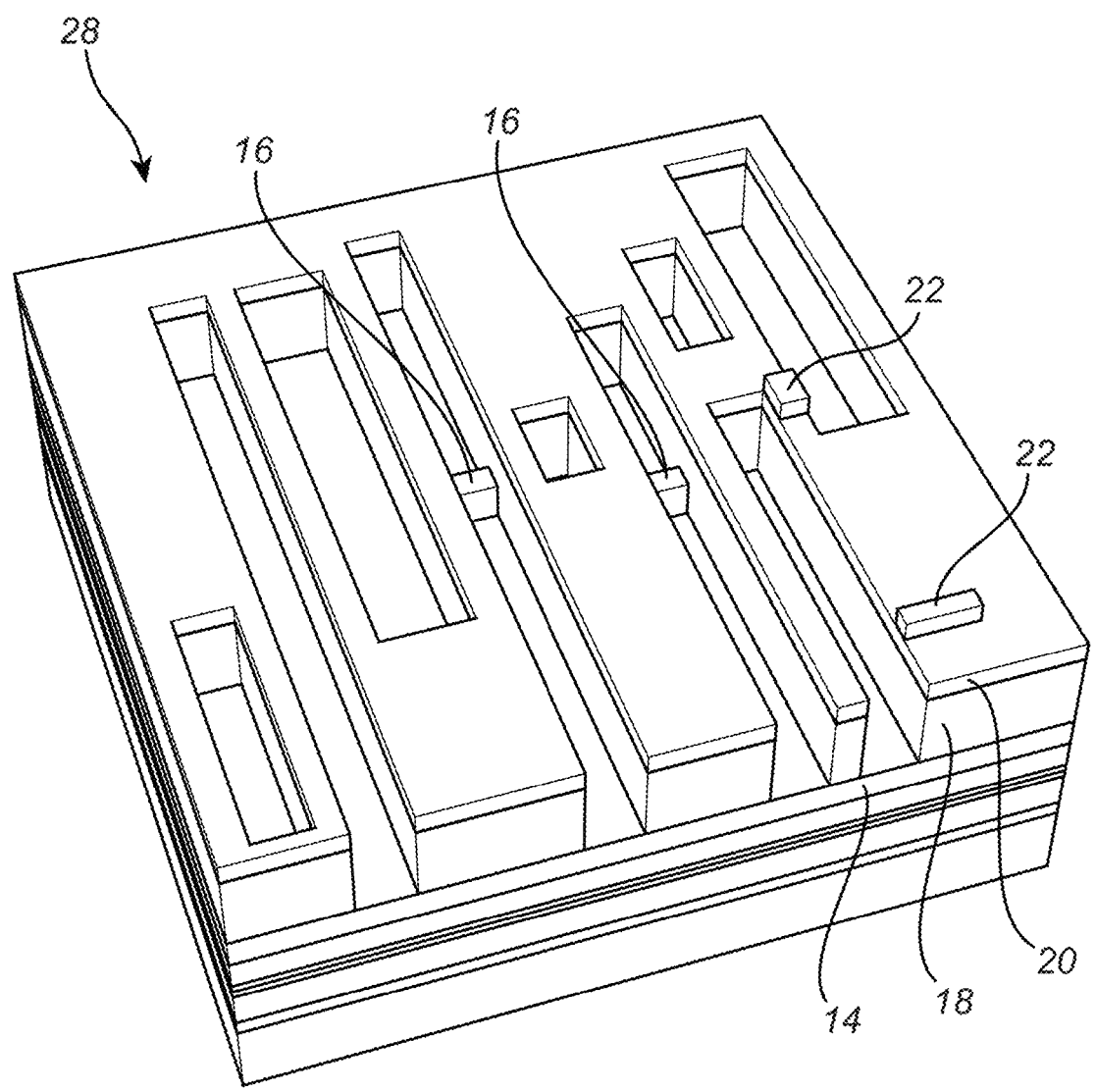

After forming the first and second blocks 16, 22 the method proceeds with patterning upper trenches 28 the upper memorization layer 18 in a lithography and etching process. In FIG. 4, an (first) upper auxiliary trench mask stack 24 is formed over the upper memorization layer 18, (e.g. on the supplementary memorization layer 20, or on the layer 18 if layer 20 is absent). FIG. 4-5 depicts patterning auxiliary upper trenches 26 in the mask stack 24 by lithography and etching. FIG. 6 illustrates an optional step of removing protruding portions of the second blocks 22 from the auxiliary upper trenches 26, prior to etching the auxiliary upper trenches 26 into the upper pattern memorization layer 18 as shown in FIG. 7. Upper trenches 28 conforming to the auxiliary upper trenches 26 may hence be formed in the upper pattern memorization layer. In other words, an upper trench 28 may be formed underneath each auxiliary upper trench 26.

As shown, the upper trenches 28 may extend along the X direction and be formed with various widths (along the Y direction). The upper trenches 28 may be formed with various longitudinal dimensions (along the X direction).

At least a subset of the upper trenches 28 may as shown extend across and expose one or more first upper blocks 16. Conversely, each first upper block 16 may be formed along an upper trench 22. A first upper block 16 may thus define a trench interruption along an upper trench 22.

With reference again to FIG. 4, the auxiliary trench mask stack 24 may comprise one or more layers of mask material 24a-24d, and a resist layer 24e as a top-most layer. The layers of mask material may for instance comprise a patterning layer 24a, one or more anti-reflective coatings such as SiOC layers and/or spin-on-glass layers 24b, 24d, and an organic spin-on material such as SOC layer 24c.

Auxiliary trenches 26 may first be formed in the resist layer 24e by lithography and then transferred downward in the stack 24 by etching. One or more layers of the stack 24 may, depending on its composition and the etching chemistries used, be consumed during the transfer process, as shown in FIG. 6 wherein only a subset of the original layers remain, e.g. layers 24a-c. In any case, the auxiliary trench mask stack 24 should however remain to such an extent that it may be used as an etch mask for patterning the upper trenches 28.

The upper trenches 28 may thereafter be formed by etching the upper memorization layer 18 through the auxiliary trenches 26, using the auxiliary trench mask stack 24 as an etch mask. The upper trenches 28 may be etched using a suitable etching process, for instance a dry etch e.g. Reactive Ion Etching (RIE). For example, etching chemistries comprising Bromine (e.g. HBr), Chlorine (e.g. $Cl_2$) or Fluorine (e.g. $SF_6$, $CF_4$) may be used to achieve a selective "a-Si etch", i.e. selective etching of a-Si with respect to the auxiliary trench mask stack 24 e.g. comprising organic spin-on material such as SOC layer 24c.

The etching of the upper memorization layer 18 may be preceded by opening the supplementary memorization layer 20 from the auxiliary trenches 26 and subsequently etching the auxiliary trenches 26 into the upper memorization layer 18.

As shown in FIG. 5, a respective portion of at least a subset of the second upper blocks 22 protrude into a region in which an auxiliary upper trench 26 is later formed. The method may accordingly comprise etching away the respective block portions exposed in the auxiliary upper trenches 26. This may provide an increased robustness against EPE during the formation of the second upper blocks 22. A second upper block 22 may be formed with a transverse dimension (i.e. a length dimension, along the Y direction) exceeding an intended width (i.e. along the Y direction) of a second lower trench 50 for which the second upper block 22 is to define a trench interruption. Forming such elongated second upper blocks 22 may facilitate aligning the second upper blocks 22 with the second lower trenches 50 to be formed, e.g. avoiding that a second upper block 22 results in a partially interrupted a second lower trench 50. Meanwhile, the ends of the thusly "trimmed" second upper blocks 50 may be self-aligned with respect to the auxiliary upper trenches 26.

During this etch step, the supplementary memorization layer 20 may be used as an etch stop layer, c.f. FIG. 5. By way of example, TiN block portions may be etched in a selective manner with respect to a SiN layer using an $Cl_2$ based chemistry. Trimming of the second upper blocks 22 is however possible also in absence of the supplementary memorization layer 20 provided there is a sufficient etch contrast between the material of the upper memorization layer 18 and the second upper blocks 22 to allow away of the protruding second upper block portions without introducing a too large topography variation of the upper memorization layer 18 within the auxiliary upper trenches 26.

Figure 18:
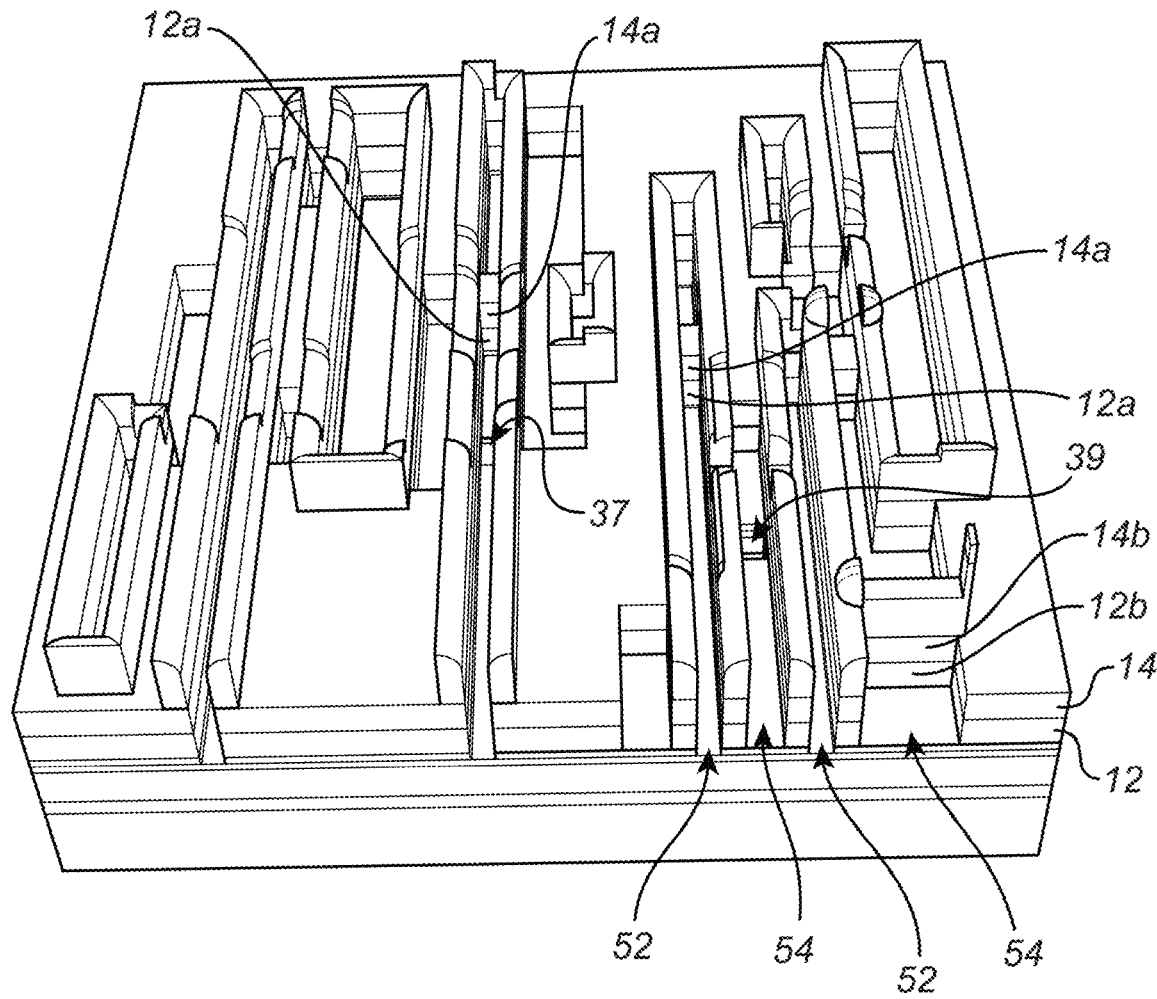

FIG. 7 shows the thusly patterned upper memorization layer 18 with the upper trenches 28 formed therein, after removing the (remaining portions) auxiliary trench mask stack 24. For example, removing the auxiliary trench mask stack 24 may comprise an "SOC etch", such as a RIE using an Ar- or He-diluted oxygen-comprising etching chemistry, or an $N_2/H_2$ based etching chemistry. The upper trenches 28 may as shown expose upper surface portions of the lower memorization layer 14. Each upper trench 28 is formed above a region/portion of the hardmask layer 12 (and insulating layer 10) where a first target trench 52 is to be formed (c.f. FIG. 18). The second upper blocks 22 (which as discussed above may be trimmed) remain over the patterned upper memorization layer 18, e.g. on the patterned supplementary memorization layer 20.

Figure 8:
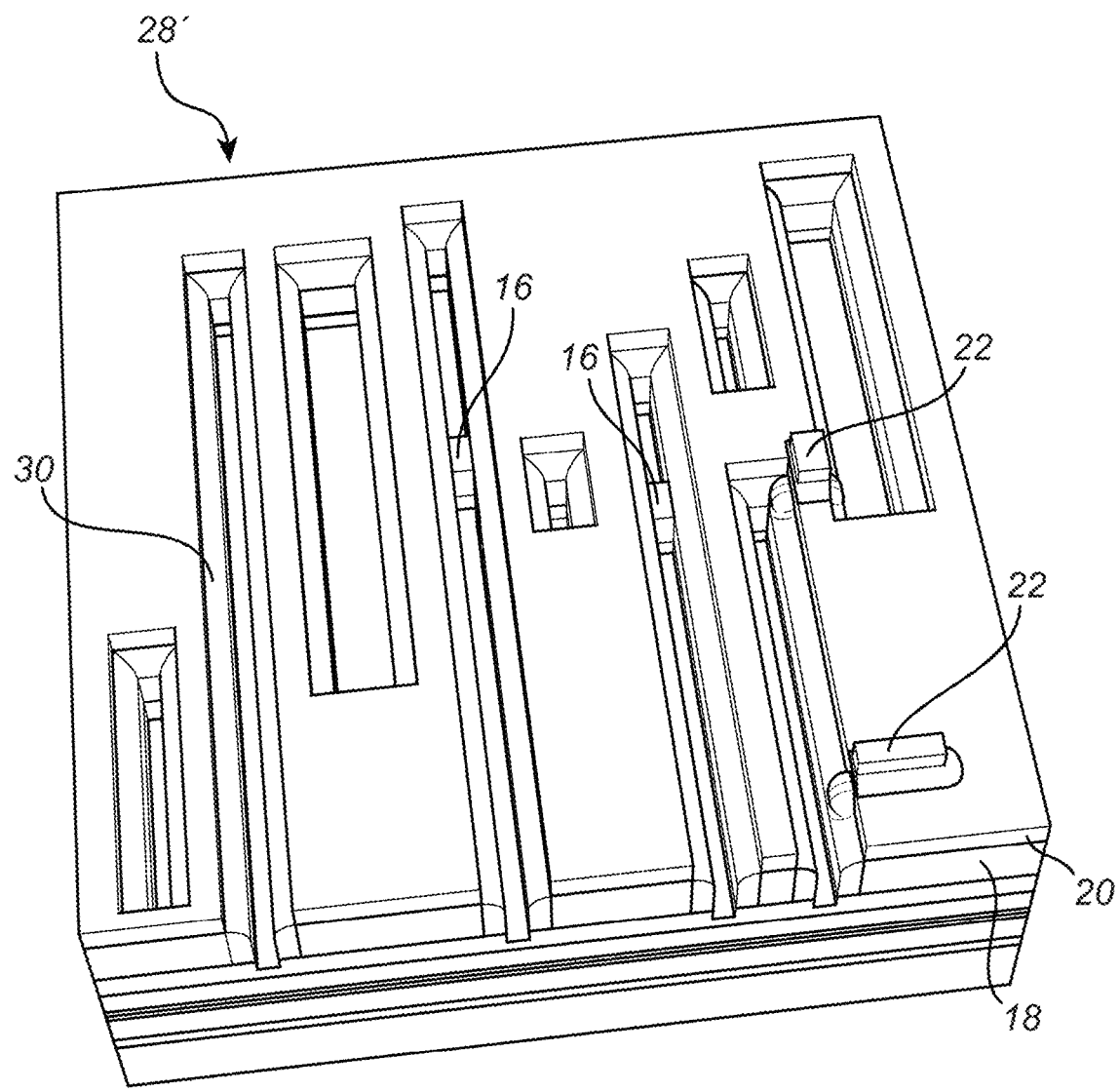

In FIG. 8 spacer lines 30 are along sidewalls of the upper trenches 28, thereby defining a set of spacer-provided upper trenches 28' in the upper memorization layer 18, at least a subset being interrupted by a respective first upper block 16.

Figure 10:
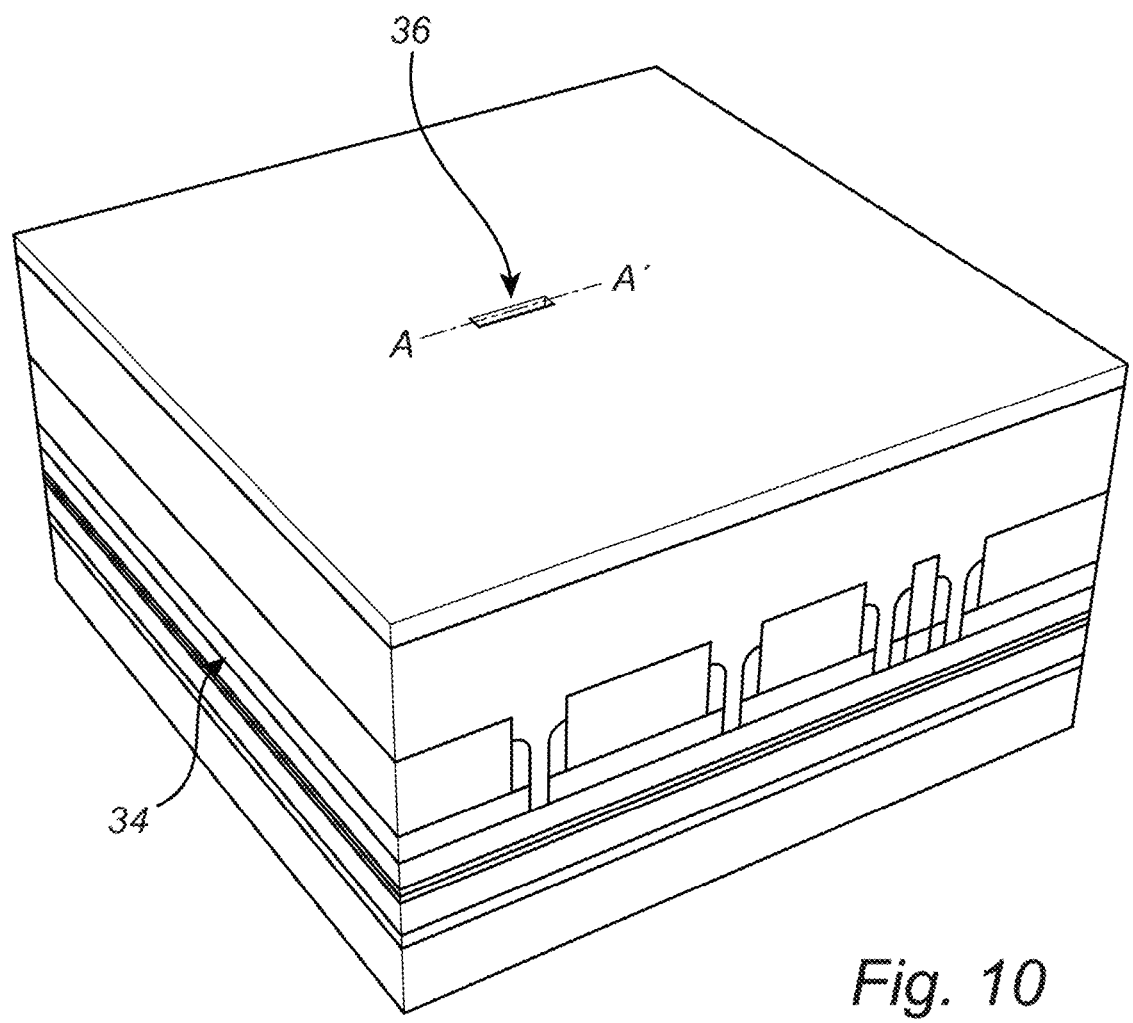

The spacer lines 24 may be formed in a sidewall spacer deposition process by anisotropically etching back (top-down) an ALD-deposited material layer such as oxide e.g. $SiO_2$ or a metal oxide layer e.g. $AlO_x$ or $TiO_x$, or a carbide or nitride e.g. SiCO, SiN, AlN, AlON, SiCN. The spacer lines 30 may as shown in FIG. 10 conform to the sidewalls of each upper trench 28. In other word, the spacer lines 30 may cover and extend along the sidewalls of the upper trenches 28.

Figure 9:
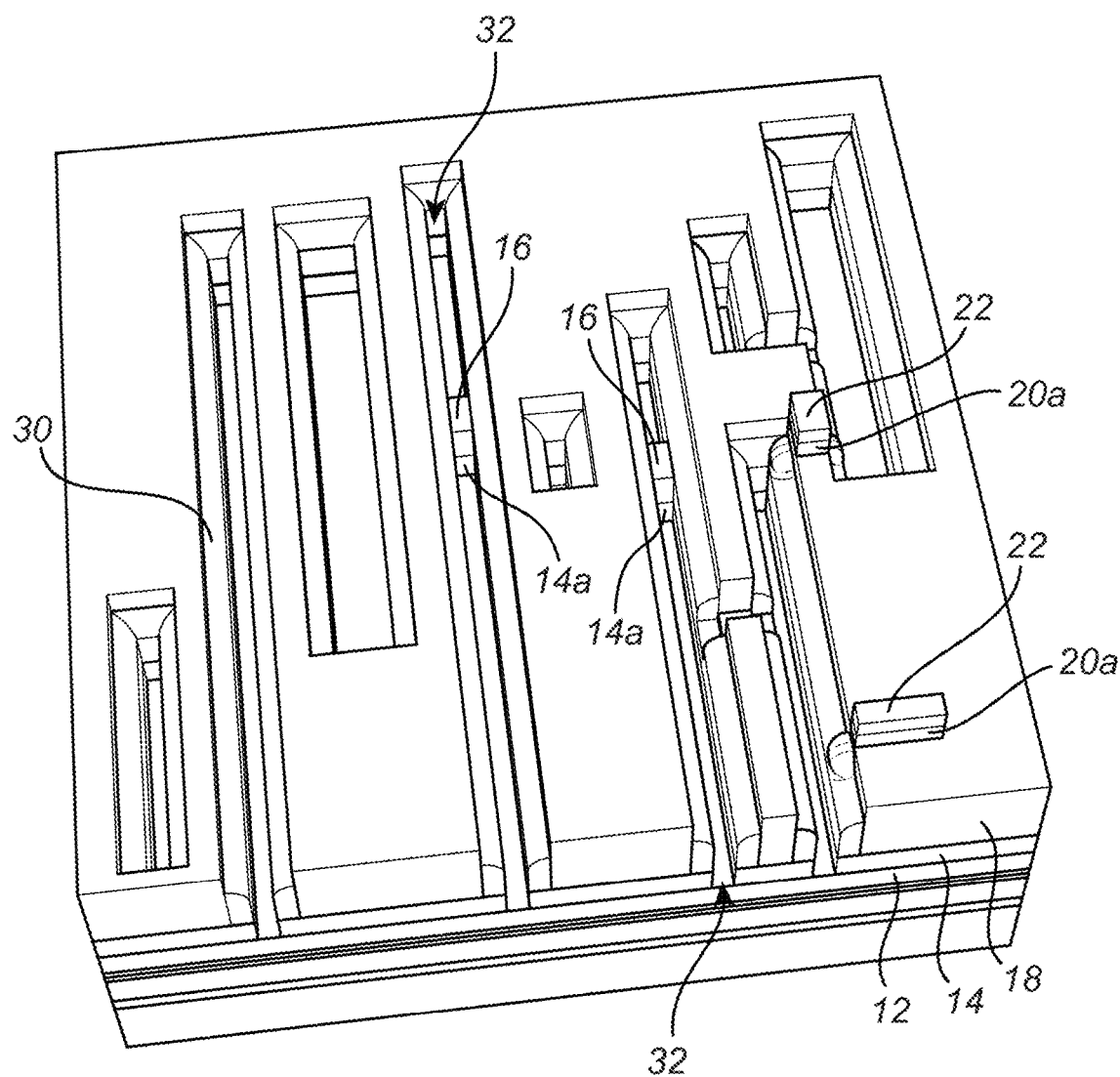

In FIG. 9, the lower memorization layer 14 has been patterned to form the first lower trenches 32 therein. The patterning may comprise etching the spacer-provided upper trenches 28' into the lower memorization layer 14. In other words, the lower memorization layer 14 may be etched while the spacer lines 24 the first upper blocks 19, the patterned upper memorization layer 20 acts as an etch mask.

Accordingly, at least a subset of the first lower trenches 32 may be interrupted along its length by a lower memorization layer portion 14a ("first lower block portion") preserved underneath the respective first upper blocks 16.

After the patterning of the lower memorization layer 14, the first upper blocks 16 and the spacer line-provided upper trenches 28' have thus been "memorized" in the patterned lower memorization layer 14.

The patterning of the lower memorization layer 14 may comprise an etching process, such as a dry etching process, allowing the lower memorization layer 14 to be etched selectively to the upper memorization layer 20, the spacer lines 30 and the first upper blocks 16. For instance, a RIE comprising e.g. a fluorine-based chemistry (e.g. $CHF_3$, $CH_3F$, $C_4F_8$, $CF_4$, $CH_2F_2$), optionally using a continuous wave plasma, plasma pulsing or a cycling process (e.g. Quasi-Atomic Layer etching), may be used to achieve a selective "SiN etch" etching SiN selectively to each one of TiN, a-Si and an oxide such as a silicon or metal oxide (e.g. $SiO_2$ or $TiO_x$).

As shown in FIG. 9, simultaneous to the etching the first lower trenches 32 into the lower memorization layer 14, the supplementary pattern memorization layer 20 has been etched using the second upper blocks 22 as etch masks. A pattern of supplementary upper blocks 20a conforming to the pattern of second upper blocks 22 has hence been formed. Each supplementary upper block 20a is formed by a portion of the supplementary pattern memorization layer 20 preserved underneath a respective second upper block 22. The simultaneous etching of layers 14 and 20 is enabled by the similar etch properties thereof. If the layers 14 and 20 instead are formed of different materials the layers 14 and 20 may be etched sequentially, e.g. first the supplementary pattern memorization layer 20 and then the lower memorization layer 14.

Figure 14:
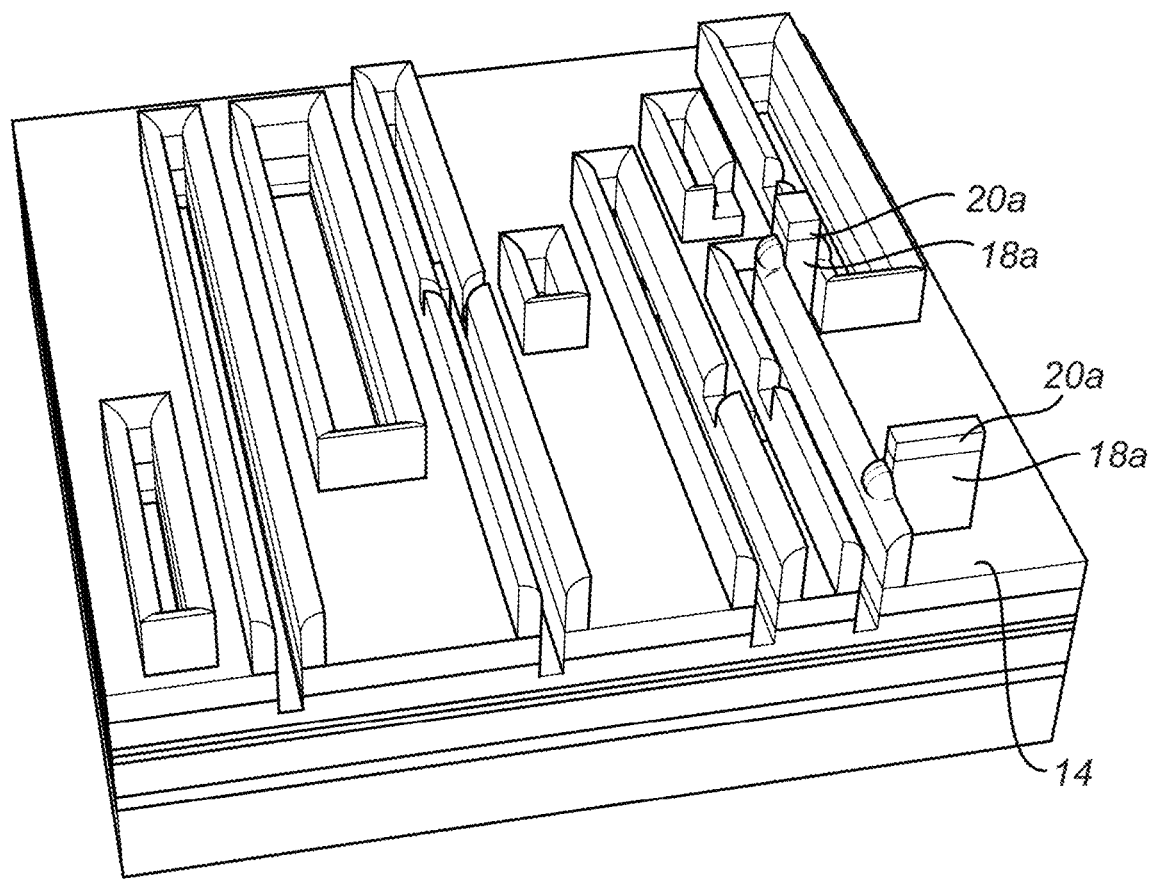

In the illustrated process the second upper blocks 22 remain on the supplementary upper blocks 20a after forming the supplementary upper blocks 20a. This is however merely one example, and other options are possible such as removing the second upper blocks 22 after forming the supplementary upper blocks 20a, after forming third upper block portions 18a (c.f. FIG. 14), after forming the second lower trenches 50, or after forming the second target trenches 54.

Figure 10A:
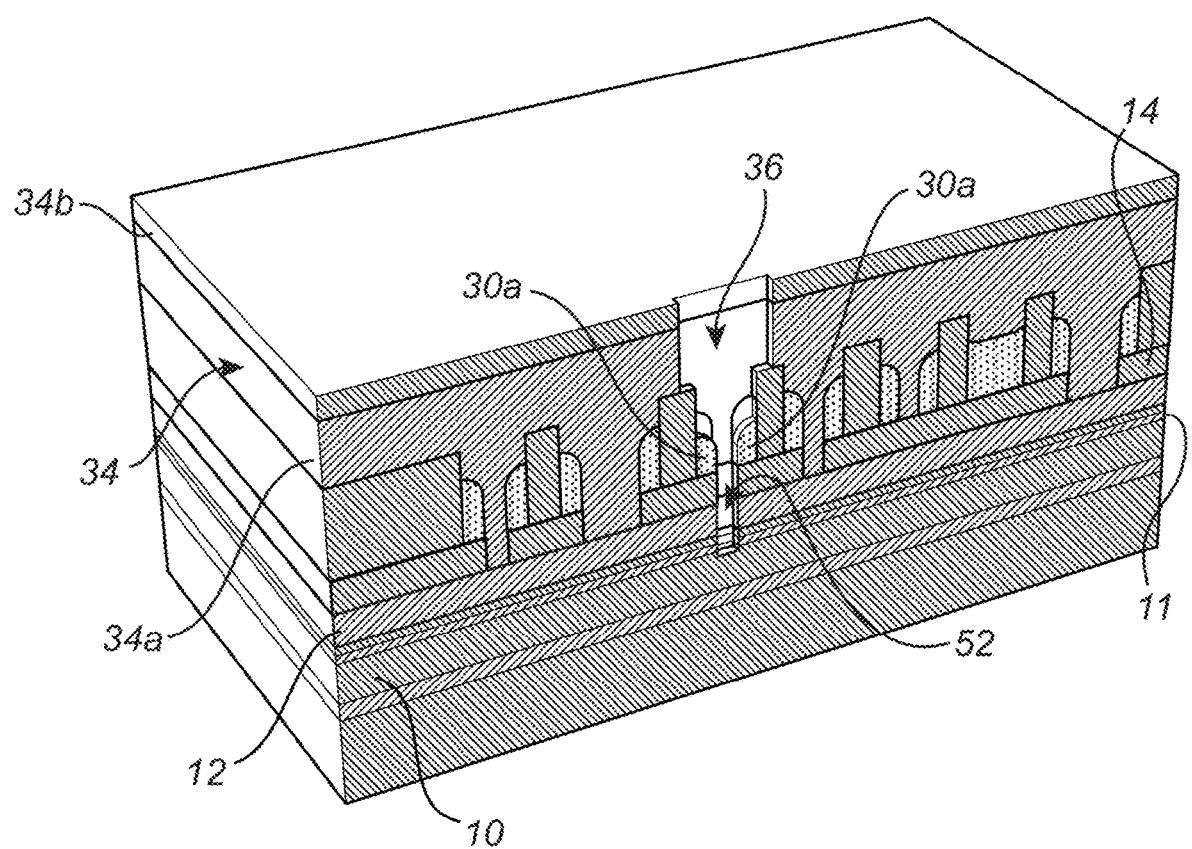
Figure 11:
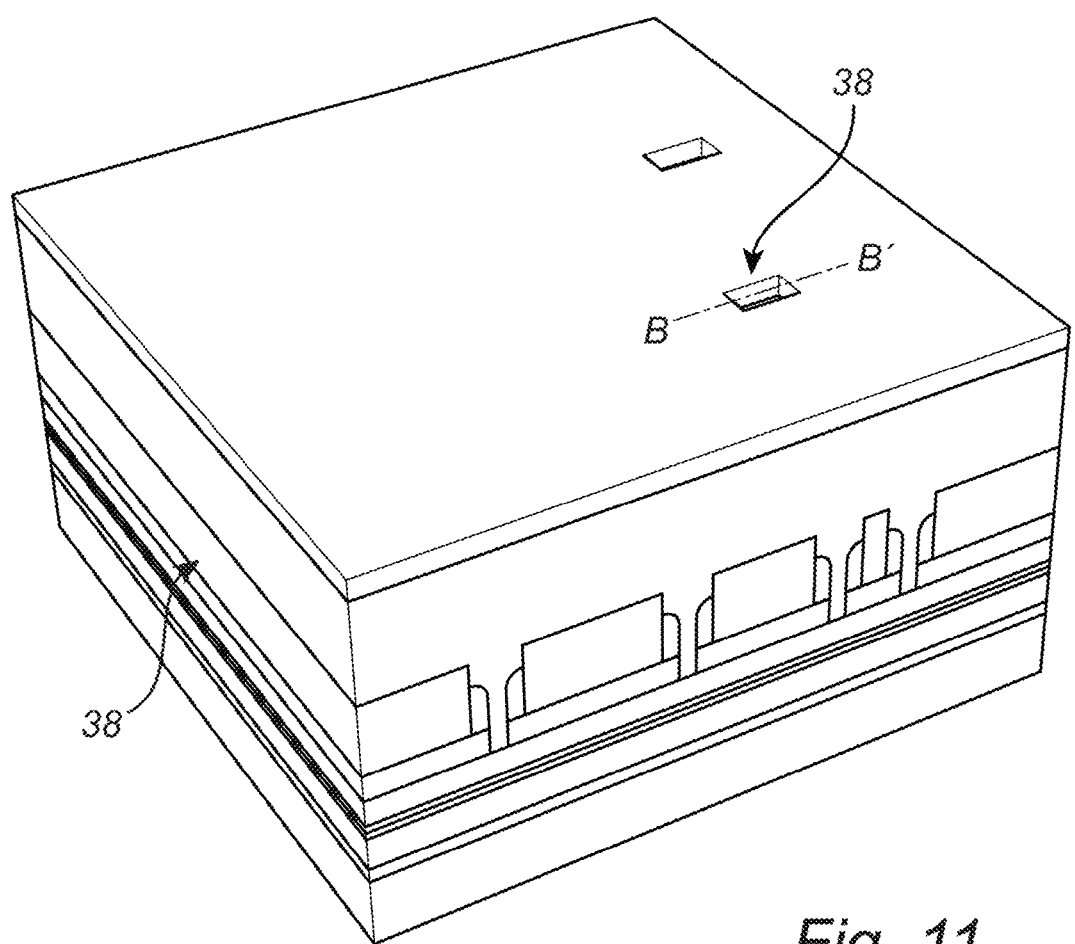
Figure 11A:
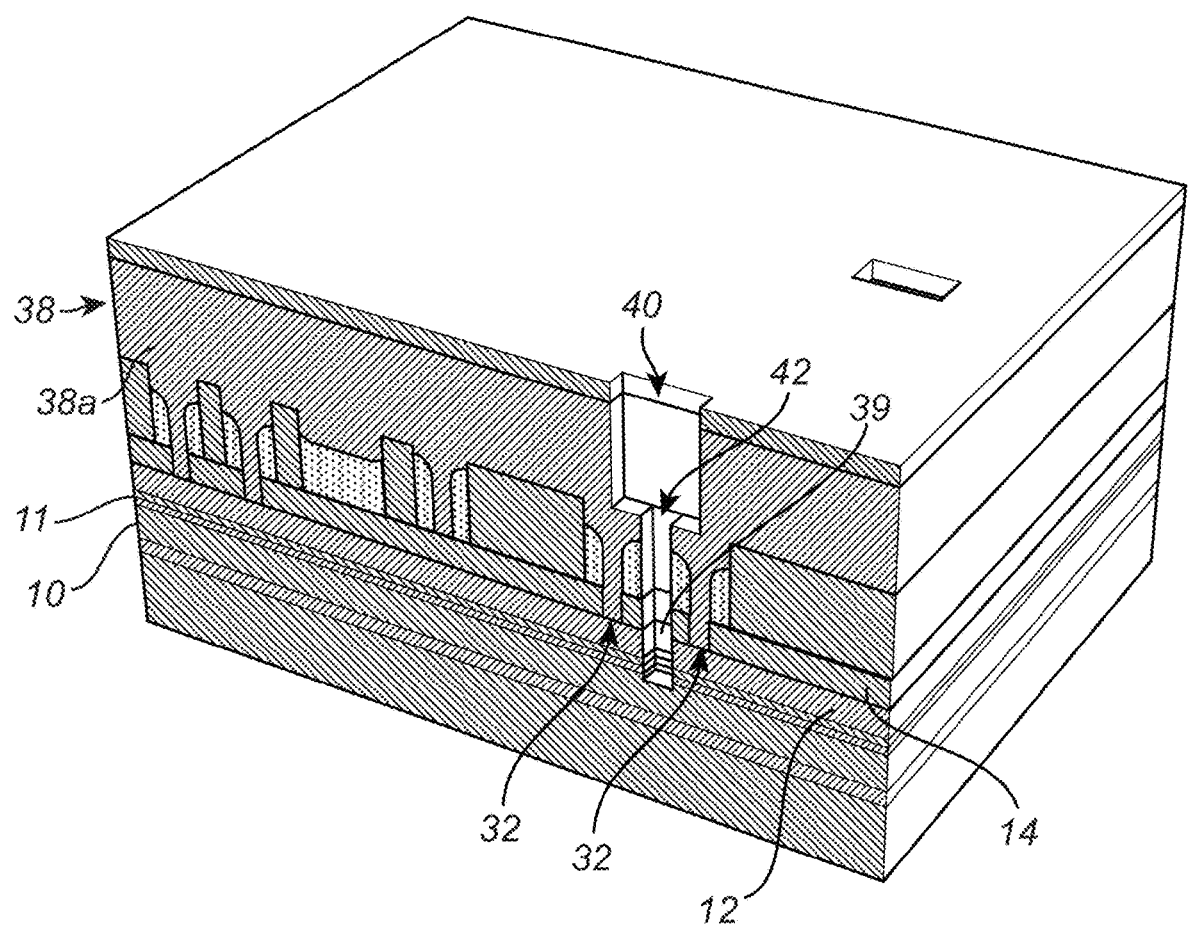

FIGS. 10 and 10A illustrate a (first) via hole formation process for patterning (first) via openings aligned with the first set of lower trenches 32, and accordingly with the first target trenches 52. FIGS. 11 and 11A illustrate a (second) via hole formation process for patterning (second) via holes aligned with the second set of lower trenches 50, and accordingly with the second target trenches 54. FIGS. 10 and 11 respectively show forming of a single via hole and two via holes, however as may be appreciated any number of via holes may be formed in a corresponding manner. If it is not desired to form first and/or second via holes, the relevant steps may be omitted. The method may thereafter proceed to the stage shown in FIG. 12.

FIG. 10A shows a cross section of the structure in FIG. 10 along the line A-A'. A (first) via hole etch stack 34 has been formed over the structure. The via hole etch stack 34 may comprise one or more layers of mask material such as a planarizing layer 34a covering the patterned upper memorization layer 20 and the supplementary and/or second upper blocks 20a, 22. The planarizing layer mask material may comprise be SOC or some conventional other organic spin-on layer. The via hole etch stack 34 may further comprise a resist layer 34b as top-most layer. Although not shown, the via hole etch stack 34 may comprise additional mask materials, such as one or more anti-reflective coatings, such as SiOC layers, and/or a spin-on-glass layer.

An opening 36 may be formed in the via hole etch stack 34 by lithography and etching. The opening may be formed above a "selected" first lower trench 36 at a location overlying a region of the insulating layer 10 where a via hole is desired. The opening 36 may be etched through the via hole etch stack 34 to expose a bottom surface of the selected first lower trench 26, formed e.g. by the hardmask layer 12.

As shown in FIG. 10A the bottom surface may then be etched back (top-down) to extend the opening 36 into the hardmask layer 12. A via hole 37 may subsequently be formed in the insulating layer 10 (and any interfacial layers 11 if present) by etching the layer(s) 10/11 through the opening extended opening 36. After forming the via hole 37, the via hole etch stack 34 may be removed.

As illustrated in FIG. 10A, the opening 36 may be defined with a relaxed CD with respect to the selected first lower trench 32 and transferred into the stack 34 using the resist layer 34b as an etch mask while etching the mask material 34a selectively to the spacer lines 30. By etching the mask material 34a selectively also to the upper memorization layer 18, the CD of the opening 36 in the resist layer 34b may be further relaxed to overlay also portions of the upper memorization layer 18, as shown. For example, an organic spin-on material such as SOC may be etched at a greater rate than both an oxide spacer and a-Si using a SOC etch, as discussed above. The hardmask layer 12 may similarly be opened by etching the hardmask material selectively to the spacer lines 30 and optionally the upper memorization layer 14. As an example, a TiN hardmask layer 12 may be opened employing an Cl$_2$/CH$_4$/Ar chemistry or a Cl$_2$/HBr chemistry. The amount of etch back of the spacer layer portions 30 exposed in the opening 36 visible in FIG. 10A is merely an example and may vary with the degree of selectivity of the etching processes used.

FIG. 11A shows a cross section of the structure in FIG. 11 along the line B-B'. A (second) via hole etch stack 38 has been formed over the structure. The via hole etch stack 38 may generally have a same composition as the (first) via hole stack 34 and accordingly comprise a planarizing layer of masking material 38a (e.g. SOC) and a top-most resist layer 38b. A via opening 40 may similarly be formed in the via hole etch stack 38 using lithography and etching. The second via hole formation process however differs from the first via formation process in that the via opening 40 is defined at a location between a pair of spacer-provided upper trenches 28', thus overlying a portion of the lower memorization layer 14 where a second lower trench 50 is to be formed. Hence, the via opening 40 needs to be transferred through also the upper memorization layer 18 (e.g. using a selective "a-Si etch") and the lower memorization layer 14 (e.g. using a selective "SiN etch") before etching the via hole 39 in the insulating layer 10. After forming the via hole 39, the via hole etch stack 38 may be removed.

Figure 12:
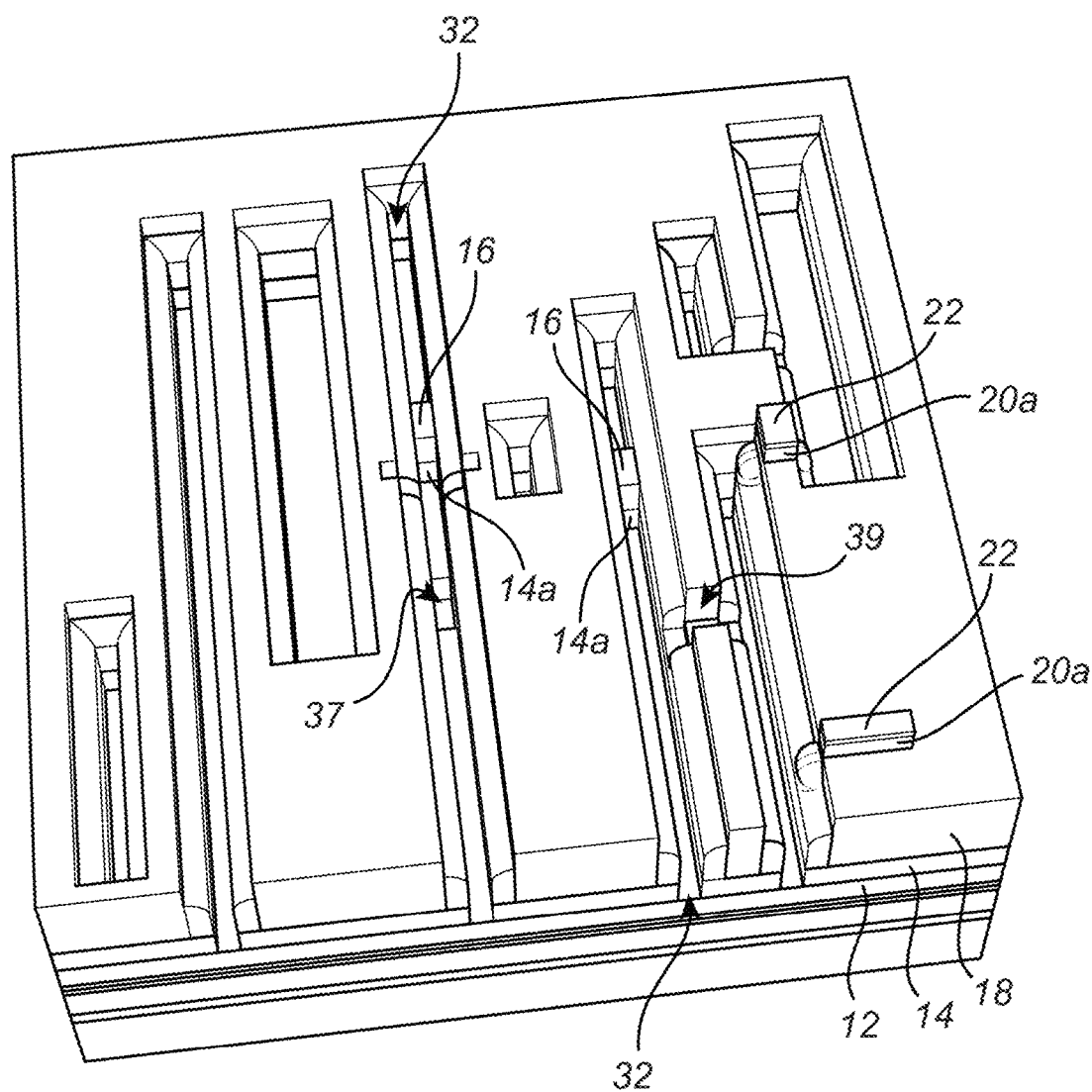

FIG. 12 shows the structure after completing the first and second via hole formation process. A depth of the via holes 37 and/or 39 may at this stage be of only an initial depth, and deepened at a later stage, such as during the etching of trenches in the insulating layer 10.

The method proceeds with patterning second lower trenches 50 in the lower memorization layer 14. The patterning comprises a number of process steps, as will be described with reference to FIGS. 13-17.

Figure 13:
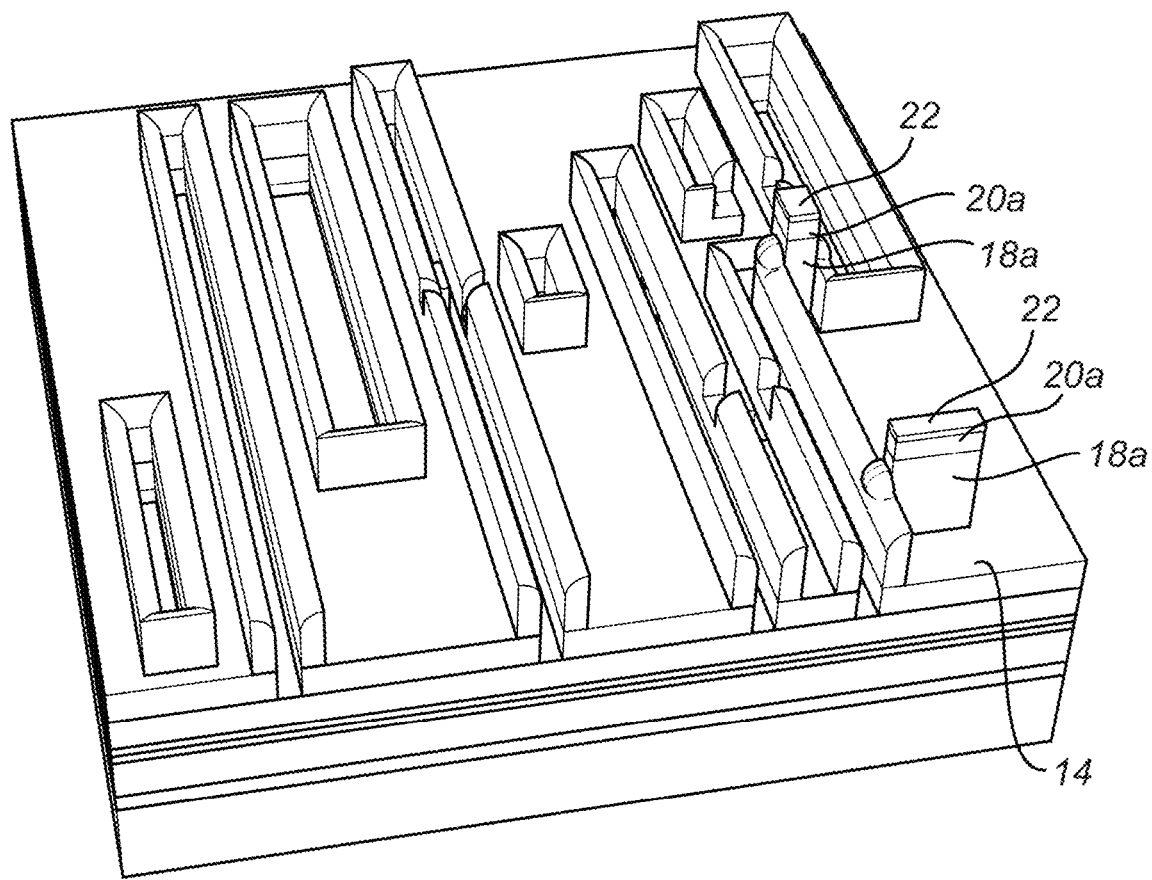

In FIG. 13 the upper memorization layer 18 is further patterned to form a pattern of upper memorization layer portions 18a ("third upper block portions") conforming to the pattern of second upper blocks 22. The patterning may comprise etching the upper memorization layer 18 using the second upper blocks 22 as etch masks (e.g. using a selective "a-Si etch"). The upper memorization layer 18 may hence be removed from "non-block" regions while preserving third upper block portions 18a underneath the second upper blocks 22.

In FIG. 14 the second upper blocks 22 are removed by etching. This optional step allows avoiding remaining portions of the second upper blocks 22 falling unto underlying layers during subsequent process steps of removing underlying materials, such as removing the third upper blocks 18a as described below.

As may be appreciated, removal of the second upper blocks 22 may however result in simultaneous etching of the first upper blocks 16. In case the first and second upper blocks 16, 22 are formed of materials with similar etch properties (e.g. the same material) this may reduce a mask budget of the first upper blocks 16. Forming the first upper blocks 16 with a greater thickness than the second upper blocks 22 may however allow the second upper blocks 22 to be removed such that at least a thickness portion of the first upper blocks 16 may remain to provide masking of first lower block portions 14a during subsequent patterning of the lower memorization layer 14.

Figure 15:
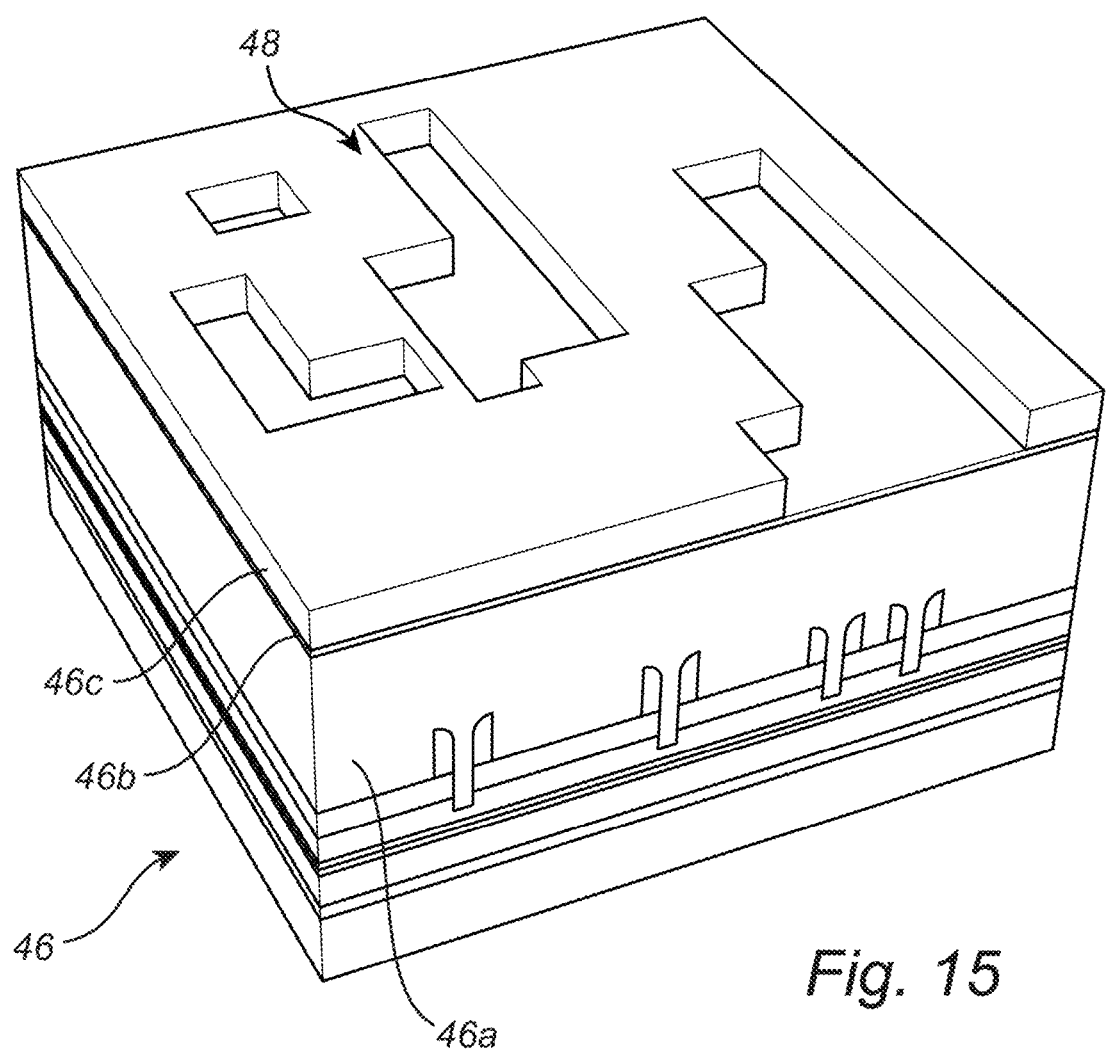

In FIG. 15, an (second) auxiliary trench mask stack 46 is formed over the lower memorization layer 14, the spacer lines 30 and the third upper block portions 18a. The auxiliary trench mask stack 46 may comprise one or more layers of mask material covering the lower memorization layer 14 and the third upper block portions 18a. The stack 46 may as shown comprise a planarizing layer 46a of mask material, e.g. an organic spin-on material such as SOC. The stack 46 may comprise a top-most photo resist layer 46c. The stack 46 may comprise one or more additional layers 46b, such as such as one or more anti-reflective coatings, such as SiOC layers, and/or a spin-on-glass layer.

Figure 16:
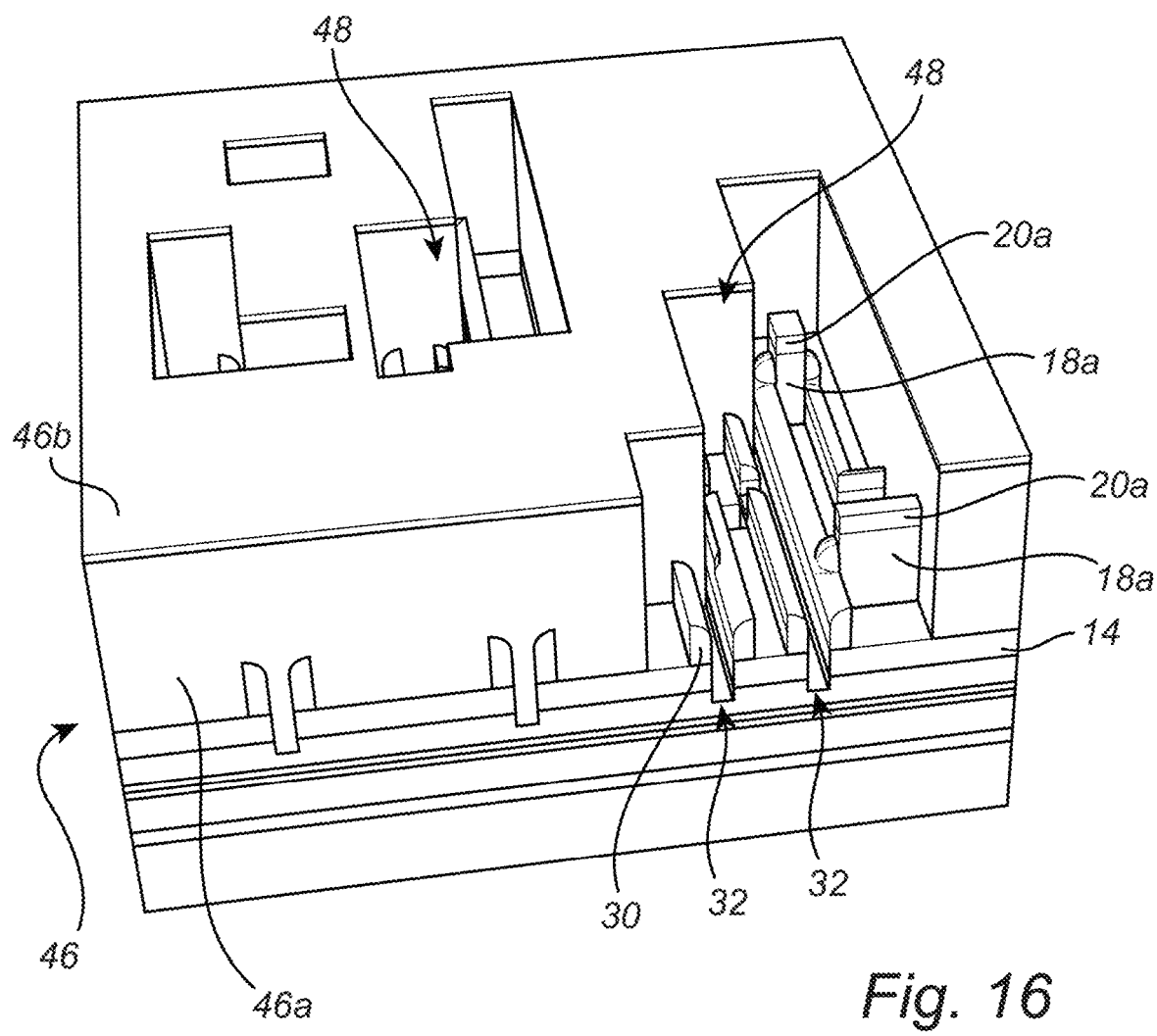

Auxiliary trenches 48 may be patterned in the auxiliary trench mask stack 46 by defining the trenches 48 in the photo resist layer 48c using lithography and then etching the trenches 48 further into the below layers of the stack 46 as shown in FIG. 16, e.g. through the planarizing layer 46a.

As shown, the auxiliary trenches 48 may extend along the X direction and be formed with various widths (along the Y direction). The auxiliary trenches 48 may be formed with various longitudinal dimensions (along the X direction).

At least a subset of the auxiliary trenches 48 may as shown extend across and expose one or more third upper block portions 18a, and (if present) supplementary blocks 20a on top. Conversely, each third upper block portion 18a may be formed along an auxiliary trench 48.

At least a subset of the auxiliary trenches 48 may as further shown be formed with an increased CD (i.e. width) to extend above a portion of the patterned lower pattern memorization layer 14 in which a second lower trench is to be formed, and above an adjacent first lower trench 32, or a pair of first lower trenches on either side thereof (e.g. portion 14c). The presence of the spacer lines 30 may ensure a minimum separation between an adjacent first and second lower trench 32, 50.

An increased CD auxiliary trench 48 may further extend above a first lower block portion 14a along a first lower trench 32. The presence of the first upper block 16 on top of the lower block portion 14a may ensure that the first lower block portion 14a is preserved when the lower memorization layer 14 is etched via the auxiliary trenches 48, thus preserving the earlier memorized trench interruptions for the first lower trenches. This may be more readily seen in the inset of FIG. 17, representing a cross section along a first lower trench 32 adjacent a second lower trench 50.

Figure 17:
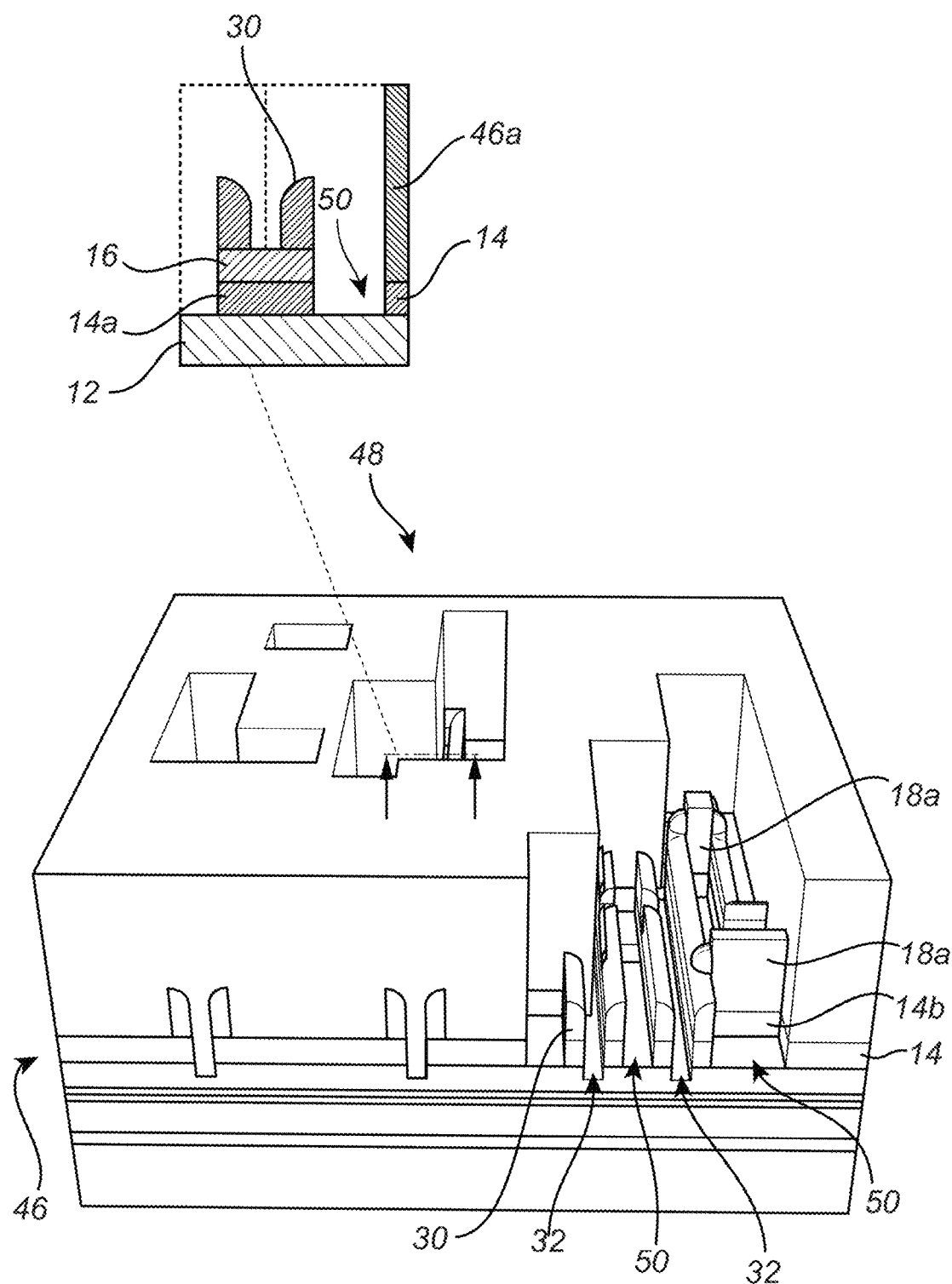

In FIG. 17, the patterning of the second lower trenches 50 is completed by etching the second lower trenches 50 in the lower memorization layer 14. During the etching, the patterned auxiliary trench mask stack 46, the spacer lines 30 act as etch masks together with the third upper block portions 18a and the supplementary blocks 20a. Accordingly, the second lower trenches 50 may be etched in regions of the lower memorization layer 50 exposed within the auxiliary trenches 48. At least a subset of the second lower trenches 50 may hence be interrupted by a lower pattern memorization layer portion 14b ("second lower block portion") preserved at a position underneath a respective one of the third upper block portions 18a. The second lower trenches 50 may for example be etched using a selective "SiN etch", as described above.

Second lower trenches 50 etched via relaxed CD auxiliary trenches 48 may as shown be from adjacent first lower trenches 32 by a respective (line-shaped) lower pattern memorization layer portion preserved underneath the spacer lines 30. As shown, at least the second lower trenches 50 etched via the relaxed CD auxiliary trenches 48 may be formed alternatingly with the first lower trenches 32.

As indicated in FIG. 17 the etching of the lower memorization layer 14 may consume also the supplementary blocks 20a. This is the result of the similar etch properties of the blocks 20a and the layer 14. If the layers 14 and 20 instead are formed of different materials providing a sufficient etch contrast, the supplementary blocks 20a may remain after completing the etching of the second lower trenches 50.

Although in the illustrated process flow, the second upper blocks 22 have been removed prior to etching the second lower trenches 50, the second upper blocks have been used as etch masks to pattern the supplementary blocks 20a and/or third upper block portions 18a, and have accordingly been used as etch masks for defining the trench interruptions for the second lower trenches 50 during initial steps of patterning the second lower trenches 50. There are however variations to this approach wherein for example the second upper blocks 22 may remain to mask the third upper block portions 18a and/or supplementary blocks 20a while etching the second lower trenches 50.

In FIG. 18, the auxiliary trench mask stack 46 has been removed from patterned lower memorization layer 14 (e.g. using an SOC etch), thus revealing the patterned lower memorization layer 14 with the first and second lower trenches 32, 50 formed therein.

The hardmask layer 12 has further been patterned using the patterned lower pattern memorization layer 14 as an etch mask. The target trenches 52, 54 may thus be formed by etching the lower trenches 32, 50 into the hardmask layer 12 to form a first target trench 52 underneath each first lower trench 32 and a second target trench 54 underneath each second lower trench 50.

Underneath each first lower block portion 14a, a first hardmask block portion 12a has been formed, interrupting a respective first target trench 52. Underneath each second lower block portion 14b, a second hardmask block portion 12b has been formed, interrupting a respective second target trench 54.

Figure 19:
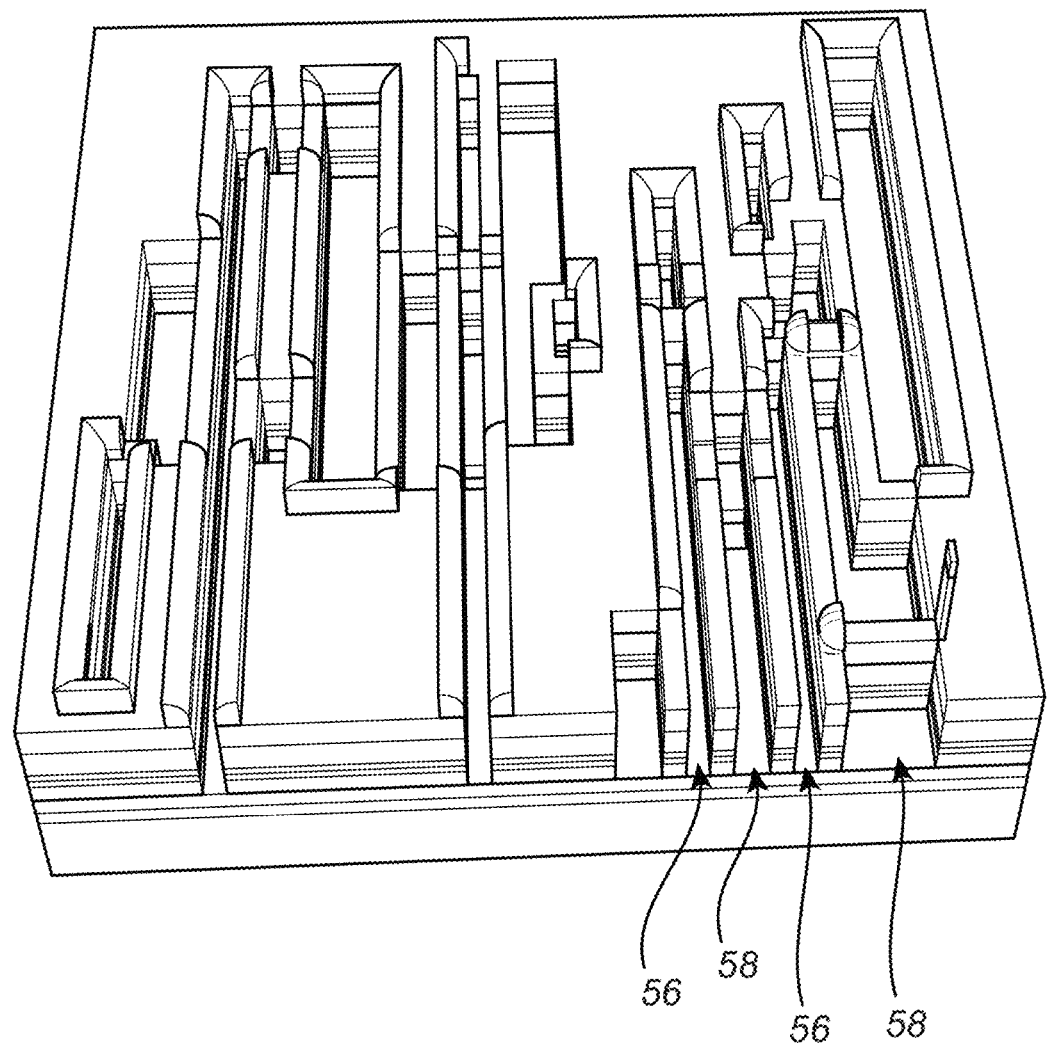

In FIG. 19, trenches have further been etched in the insulating layer 10 and the interfacial layer(s) 11 while (at least) the patterned hardmask layer 12 masks the layer(s) 10/11, thereby forming a first trench 56 underneath each first target trench 52 and a second trench 58 underneath each second target trench 54. Hence, the trench pattern defined in lower memorization layer 14 has been transferred into the hardmask layer 12, and subsequently into the insulating layer 10, including any interrupted trenches.

The etching of the trenches in the insulating layer 10 may simultaneously result in final deepened via holes 37', 39', like in a conventional dual damascene process.

The trenches 56, 58 and via holes 37', 39' in the insulating layer 10 may thereafter be filled with a conductive material to form conductive lines and conductive vias of the interconnection structure. As may be appreciated, the conductive material may however be deposited first after removing the masking features (e.g. hardmask layer 12 and lower memorization layer 14). The conductive material may be one or more metals conventionally used to form metal lines and vias in BEOL processing, such as W, Cu, Al, Ru to provide a few non-limiting examples.

In the above the inventive concept has mainly been described with reference to a limited number of examples.

However, as is readily appreciated by a person skilled in the art, other examples than the ones disclosed above are equally possible within the scope of the inventive concept, as defined by the appended claims.

For example, the method may proceed with depositing a further insulating layer over the insulating layer 10 and the metal lines and vias therein. The above method steps may thereafter be repeated to form a further higher interconnection level. This may be repeated until a desired number of interconnection levels have been formed.

In FIG. 18, the hardmask layer 12 is masked also by the third upper block portions 18a and the spacer lines 30. This may provide an increased mask budget during the patterning of the hardmask layer 12. However, it is possible to remove one or more of these features before the patterning. Also the lower memorization layer 14 may be removed prior to forming the trenches 56, 58 in the insulating layer 10.

Moreover, in the illustrated process flow, the target trenches 52, 54 are etched simultaneously. However, a sequential approach is also possible wherein the first target trenches 52 are etched in the hardmask layer 12 prior to the second target trenches 54. The first target trenches 52 may for example be formed subsequent to forming the first lower trenches 32 and prior to forming the third upper block portions 18a (e.g. prior to the first via hole formation process). The second target trenches 54 may be formed subsequent to forming the second lower trenches 50.

According to yet another variation, a separate step of patterning third upper block portions 18a as depicted in FIG. 13 may be omitted. Instead the auxiliary trench mask stack 46 may be formed over the upper pattern memorization layer 18 as shown in FIG. 12, i.e. with the spacer-provided upper trenches 28' still remaining. The patterning of the second lower trenches 50 may then proceed in the manner outlined in connection with FIGS. 15-17 but additionally comprising etching back upper surface portions of the patterned upper memorization layer 18 exposed in the auxiliary trenches 48, and subsequently etching back upper surface portions of the lower pattern memorization layer 14 exposed in the auxiliary trenches 48. During the etch back of the patterned upper pattern memorization layer, the second upper blocks 22 and/or the supplementary upper blocks 20a may act as an etch mask to define interruptions for the second lower trenches 50. The auxiliary trench mask stack 18a, and portions of the upper memorization layer 18 masked by the auxiliary trench mask stack 18, may thereafter be removed.

The invention claimed is:

1. A patterning method comprising:
   over a lower pattern memorization layer for memorizing a pattern of first and second lower trenches, forming a pattern of first upper blocks, then an upper pattern memorization layer and then a pattern of second upper blocks;
   thereafter patterning upper trenches in the upper pattern memorization layer using lithography and etching, and forming spacer lines along sidewalls of the upper trenches to define spacer-provided upper trenches, at least a subset being interrupted by a respective first upper block;
   patterning the first lower trenches in the lower pattern memorization layer by etching the spacer-provided upper trenches into the lower pattern memorization layer, at least a subset of the first lower trenches being interrupted by a respective lower pattern memorization layer portion preserved at a location defined by a respective one of the first upper blocks;
   thereafter, forming an auxiliary trench mask stack and patterning auxiliary trenches therein using lithography and etching; and
   thereafter, patterning the second lower trenches in the lower pattern memorization layer, the patterning comprising using the patterned auxiliary trench mask stack, the spacer lines and the second upper blocks as etch masks, at least a subset of the second lower trenches being interrupted by a respective lower pattern memorization layer portion preserved at a position defined by a respective one of the second upper blocks.

2. A method according to claim 1, wherein forming the pattern of first upper blocks and/or the pattern of second upper blocks comprises:
   forming an auxiliary block mask layer and block openings therein; and
   depositing block material in the block openings.

3. A method according to claim 1, wherein forming the pattern of first upper blocks and/or the pattern of second upper blocks comprises:
   forming a block material layer and then an auxiliary block mask layer;
   forming auxiliary block openings in the auxiliary block mask layer;
   depositing an auxiliary block material in the auxiliary block openings;
   removing the auxiliary block mask layer selectively to the auxiliary block material; and
   thereafter patterning the block material layer using the remaining auxiliary block material as an etch mask.

4. A method according to claim 2, wherein the block material is deposited over the auxiliary block mask layer and in the block openings and then etched back to expose the auxiliary block mask layer such that the block material remains in the block openings.

5. A method according to claim 1, wherein patterning the upper trenches comprises forming an upper auxiliary trench mask stack over the upper pattern memorization layer, patterning auxiliary upper trenches therein comprising using lithography and etching, and etching the auxiliary upper trenches into the upper pattern memorization layer,
   wherein at least a subset of the second upper blocks are formed such that a respective portion thereof protrude into a region in which an auxiliary upper trench is to be formed, wherein the method further comprises etching away said respective portions from the auxiliary upper trench.

6. A method according to claim 5, wherein a supplementary pattern memorization layer is formed between the upper pattern memorization layer and the second upper blocks, and the method further comprises using the supplementary pattern memorization layer as an etch stop layer when etching away said respective portions from the auxiliary upper trenches.

7. A method according to claim 1, wherein at least a subset of the second lower trenches are formed alternatingly with trenches of at least a subset of the first lower trenches.

8. A method according to claim 1, wherein at least one of said auxiliary trenches in the auxiliary trench mask stack extends above a portion of the patterned lower pattern memorization layer in which a second lower trench is to be formed, and above an adjacent first lower trench, wherein said second lower trench is spaced from the adjacent first lower trench by a lower pattern memorization layer portion preserved under a spacer line.

9. A method according to claim 8, wherein said auxiliary trench extends above a first upper block located along the adjacent first lower trench.

10. A method according to claim 1, wherein a supplementary pattern memorization layer is formed between the upper pattern memorization layer and the second blocks, and the method further comprises, prior to forming the auxiliary trench mask stack, patterning the supplementary pattern memorization layer to form a pattern of supplementary upper blocks conforming to the pattern of second upper blocks, the patterning comprising using the second upper blocks as etch masks.

11. A method according to claim 10, wherein the lower pattern memorization layer and the supplementary pattern memorization layer are formed as layers with similar etch properties such that the pattern of second upper blocks is transferred into the supplementary pattern memorization layer simultaneous to said etching of the spacer-provided upper trenches into the lower pattern memorization layer.

12. A method according to claim 1, further comprising, prior to forming the auxiliary trench mask stack, patterning the upper memorization layer to form a pattern of upper pattern memorization layer portions conforming to the pattern of second upper blocks, the patterning comprising using the second upper blocks as etch masks.

13. A method according to claim 12, wherein the first upper blocks are formed with a greater thickness than the second upper blocks and the method further comprises removing the second upper blocks after forming the pattern of upper pattern memorization layer portions and prior to forming the auxiliary trench mask stack, such that at least a thickness portion of the first upper blocks remain to mask the first lower pattern memorization layer portions during patterning of the second lower trenches.

14. A method according to claim 1, wherein the auxiliary trench mask stack is formed over the upper pattern memorization layer with the spacer-provided upper trenches patterned therein, wherein patterning the second lower trenches in the lower pattern memorization layer comprises etching back upper surface portions of the patterned upper pattern memorization layer exposed in the auxiliary trenches and subsequently etching back upper surface portions of the lower pattern memorization layer exposed in the auxiliary trenches.

15. A method according to claim 1, wherein the lower pattern memorization layer is formed over a target layer and the method further comprises, patterning the target layer using the patterned lower pattern memorization layer, wherein the target pattern layer is one of a hardmask layer, a dielectric layer or a metal layer.

* * * * *